(12) United States Patent
Norris

(10) Patent No.: US 11,038,470 B2
(45) Date of Patent: Jun. 15, 2021

(54) AUTONOMOUS POWER REDUCTION

(71) Applicant: Intel IP Corporation, Santa Clara, CA (US)

(72) Inventor: George Norris, Gilbert, AZ (US)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 16/958,040

(22) PCT Filed: Mar. 30, 2018

(86) PCT No.: PCT/US2018/025437
§ 371 (c)(1),
(2) Date: Jun. 25, 2020

(87) PCT Pub. No.: WO2019/190555
PCT Pub. Date: Oct. 3, 2019

(65) Prior Publication Data
US 2021/0067098 A1    Mar. 4, 2021

(51) Int. Cl.
*H03F 1/02* (2006.01)
*H03F 3/24* (2006.01)
*H04W 52/02* (2009.01)
*H04B 1/04* (2006.01)
*H03G 3/00* (2006.01)

(52) U.S. Cl.
CPC ............ *H03F 1/0233* (2013.01); *H03F 3/24* (2013.01); *H04W 52/0238* (2013.01); *H03F 2200/102* (2013.01); *H04B 2001/0416* (2013.01)

(58) Field of Classification Search
None
See application file for complete search history.

(56) References Cited

U.S. PATENT DOCUMENTS

| 6,914,487 | B1   | 7/2005 | Doyle et al. |
| 9,094,067 | B2 * | 7/2015 | Collados Asensio .... H04B 1/04 |

(Continued)

FOREIGN PATENT DOCUMENTS

WO    WO-2019190555 A1    10/2019

OTHER PUBLICATIONS

"International Application Serial No. PCT/US2018/025437, International Search Report dated Dec. 27, 2018", 3 pgs.

(Continued)

*Primary Examiner* — Pablo N Tran
(74) *Attorney, Agent, or Firm* — Schwegman Lundberg & Woessner, P.A.

(57) ABSTRACT

Aspects of an envelope tracking operation are described. In some aspects, as part of the envelope tracking operation, a device determines a change in a first set of power amplifier (PA) operating conditions, corresponding to a first look up table (LUT), the first LUT defined by a first LUT equation and a maximum supply voltage value. In some aspects, the device autonomously generates a second LUT equation to define a second LUT, having a second set of corresponding PA operating conditions. In some aspects, the device selects values from the first LUT equation, estimates a slope of the second LUT equation, determines an intercept with a maximum power value, and adjusts a supply voltage input for the PA to a supply voltage according to the maximum power value.

25 Claims, 20 Drawing Sheets

(56) References Cited

U.S. PATENT DOCUMENTS

| | | | | |
|---|---|---|---|---|
| 9,247,496 | B2* | 1/2016 | Khlat | H03F 3/245 |
| 10,003,303 | B2* | 6/2018 | Afsahi | H03F 3/45188 |
| 10,483,925 | B2* | 11/2019 | Yan | H03F 3/195 |
| 10,491,162 | B2* | 11/2019 | Chiron | H03F 1/3247 |
| 10,630,247 | B2* | 4/2020 | Jo | H03F 1/0222 |
| 10,666,200 | B2* | 5/2020 | Gebeyehu | H03F 3/193 |
| 10,749,477 | B2* | 8/2020 | Duncan | H03F 3/68 |
| 10,763,790 | B2* | 9/2020 | Emira | G01R 19/14 |
| 10,826,447 | B2* | 11/2020 | Camuffo | H03F 1/0227 |
| 2014/0028392 | A1 | 1/2014 | Wimpenny | |
| 2014/0169427 | A1 | 6/2014 | Asensio et al. | |
| 2015/0372647 | A1 | 12/2015 | Camuffo et al. | |
| 2016/0173030 | A1 | 6/2016 | Langer et al. | |
| 2019/0190467 | A1* | 6/2019 | Xia | H03F 3/245 |

OTHER PUBLICATIONS

"International Application Serial No. PCT/US2018/025437, Written Opinion dated Dec. 27, 2018", 5 pgs.

* cited by examiner

AUTONOMOUS POWER REDUCTION

CROSS-REFERENCE TO RELATED APPLICATION

This application is a U.S. National Stage Filing under 35 U.S.C. 371 from International Application No. PCT/US2018/025437, filed on 30 Mar. 2018, and published as WO 2019/190555 A1 on 3 Oct. 2019, which application is incorporated herein by reference in its entirety.

TECHNICAL FIELD

Aspects pertain to radio access networks. Some aspects relate to millimeter-wave (mmWave) band communications in cellular networks. Specifically, certain aspects relate to power management for wireless communication devices.

BACKGROUND

The ever-increasing demand for higher data rates has translated to greater amounts of power consumption and concern for battery life of mobile devices. Furthermore, certain legal emissions requirements may exist with respect to mobile devices. Given the continuous variance of data transmission requirements and operating conditions of mobile devices, power amplifiers of mobile devices may have varying power supply requirements. For example, it may be advantageous to reduce an input supply voltage level to a power amplifier when the power amplifier is in an operating state requiring less power output and correspondingly the power amplifier is not near an operating state for which the power amplifier may reach gain compression and signal distortion. In situations when an input supply voltage level to a power amplifier exceeds the needs of the power amplifier, loss of battery life, increased heat, and degraded signal quality may result.

Envelope tracking is a method used to ensure that a power amplifier is operating at a peak efficiency level for every required power level of operation. This includes continuously adjusting a power supply voltage that is applied to the supply input of the power amplifier, on a real-time basis.

BRIEF DESCRIPTION OF THE DRAWINGS

FIG. 39 illustrates aspects of exemplary transmit circuitry illustrated in FIG. 3A according to some aspects.

DETAILED DESCRIPTION

Figure 1:
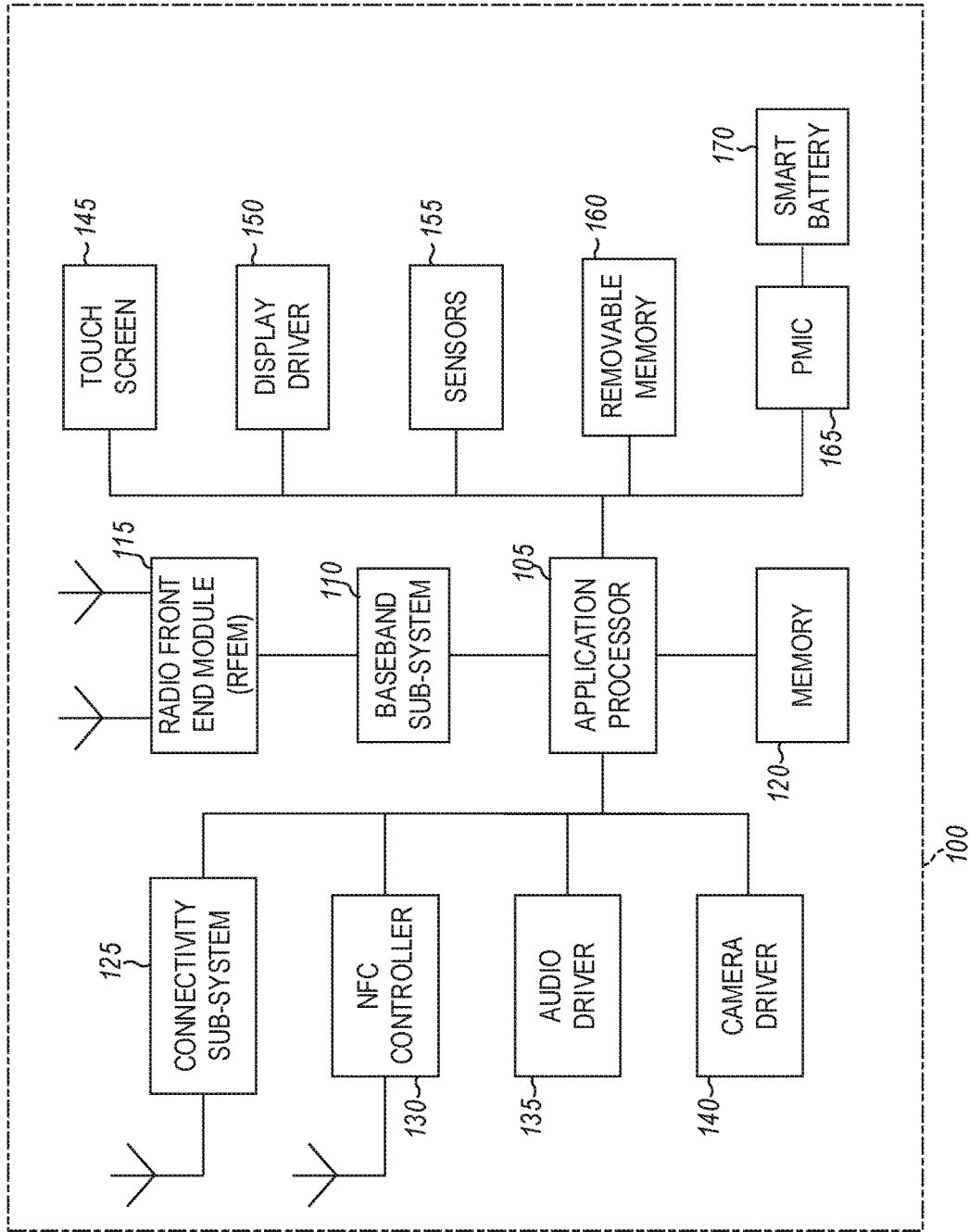
FIG. 1 illustrates an exemplary user device according to some aspects.

FIG. 1 illustrates an exemplary user device according to some aspects. The user device 100 may be a mobile device in some aspects, and includes an application processor 105, baseband processor 110 (also referred to as a baseband sub-system), radio front end module (RFEM) 115, memory 120, connectivity sub-system 125, near field communication (NEC) controller 130, audio driver 135, camera driver 140, touch screen 145, display driver 150, sensors 155, removable memory 160, power management integrated circuit (PMIC) 165, and smart battery 170.

In some aspects, application processor 105 may include, for example, one or more central processing unit (CPU) cores and one or more of cache memory, low drop-out voltage regulators (LDOs), interrupt controllers, serial interfaces such as SPI, I2C or universal programmable serial interface sub-system, real time clock (RTC), timer-counters including interval and watchdog timers, general purpose 10, memory card controllers such as SD/MMC or similar, USB interfaces, MIPI interfaces, and/or Joint Test Access Group (JTAG) test access ports.

In some aspects, baseband processor 110 may be implemented, for example, as a solder-down substrate including one or more integrated circuits, a single packaged integrated circuit soldered to a main circuit board, and/or a multi-chip module including two or more integrated circuits.

Applications of mmWave technology can include, for example, WiGig and future 5G, but the mmWave technology can be applicable to a variety of telecommunications systems. The mmWave technology can be especially attractive for short-range telecommunications systems. WiGig devices operate in the unlicensed 60 GHz band, whereas 5G mmWave is expected to operate initially in the licensed 28 GHz and 39 GHz bands. A block diagram of an example baseband sub-system 110 and RFEM 115 in a mmWave system is shown in FIG. 1A.

Figure 1A:
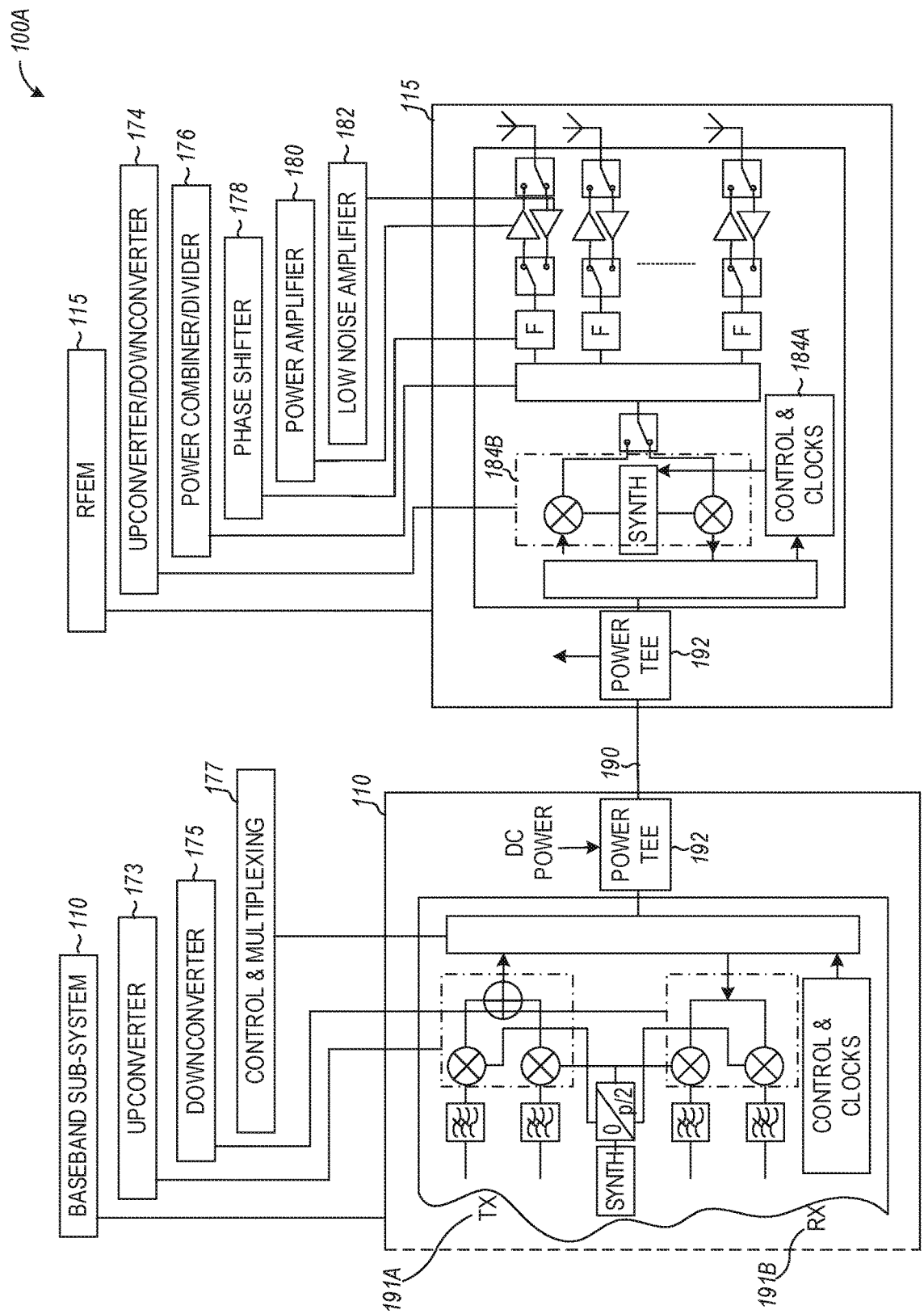
FIG. 1A illustrates a mmWave system, which can be used in connection with the device of FIG. 1 according to some aspects.

FIG. 1A illustrates a mmWave system 100A, which can be used in connection with the device 100 of FIG. 1 according to some aspects of the present disclosure. The system 100A includes two components: a baseband sub-system 110 and one or more radio front end modules (RFEMs) 115. The RFEM 115 can be connected to the baseband sub-system 110 by a single coaxial cable 190, which supplies a modulated intermediate frequency (IF) signal, DC power, clocking signals and control signals.

The baseband sub-system 110 is not shown in its entirety, but FIG. 1A rather shows an implementation of analog front end. This includes a transmitter (TX) section 191A with an upconverter 173 to intermediate frequency (IF) (around 10 GHz in current implementations), a receiver (RX) section 191B with downconversion 175 from IF to baseband, control and multiplexing circuitry 177 including a combiner to multiplex/demultiplex transmit and receive signals onto a single cable 190. In addition, power tee circuitry 192 (which includes discrete components) is included on the baseband circuit board to provide DC power for the RFEM 115. In some aspects, the combination of the TX section and RX section may be referred to as a transceiver, to which may be coupled one or more antennas or antenna arrays of the types described herein.

The RFEM 115 can be a small circuit board including a number of printed antennas and one or more RF devices containing multiple radio chains, including upconversion/downconversion 174 to millimeter wave frequencies, power combiner/divider 176, programmable phase shifting 178 and power amplifiers (PA) 180, low noise amplifiers (LNA) 182, as well as control and power management circuitry 184A and 184B. This arrangement can be different from Wi-Fi or cellular implementations, which generally have all RF and baseband functionality integrated into a single unit and only antennas connected remotely via coaxial cables.

This architectural difference can be driven by the very large power losses in coaxial cables at millimeter wave frequencies. These power losses can reduce the transmit power at the antenna and reduce receive sensitivity. In order to avoid this issue, in some aspects, PAs 180 and LNAs 182 may be moved to the RFEM 115 with integrated antennas. In addition, the RFEM 115 may include upconversion downconversion 174 so that the IF signals over the coaxial cable 190 can be at a lower frequency. Additional system context for mmWave 5G apparatuses, techniques and features is discussed herein below.

Figure 2:
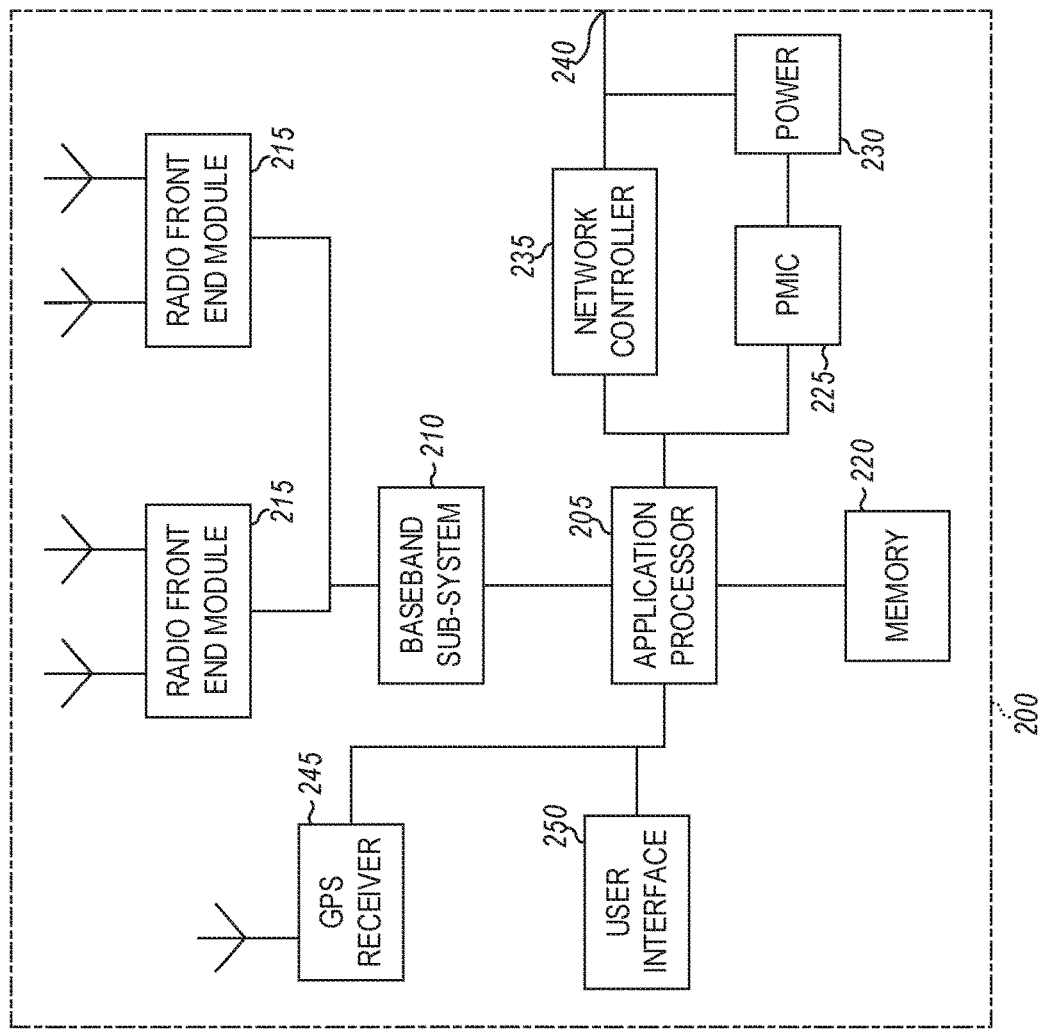
FIG. 2 illustrates an exemplary base station radio head according to some aspects.

FIG. 2 illustrates an exemplary base station or infrastructure equipment radio head according to some aspects. The base station radio head 200 may include one or more of application processor 205, baseband processors 210, one or more radio front end modules 215, memory 220, power management integrated circuitry (PMIC) 225, power tee circuitry 230, network controller 235, network interface connector 240, satellite navigation receiver (e.g., GPS receiver) 245, and user interface 250.

In some aspects, application processor 205 may include one or more CPU cores and one or more of cache memory, low drop-out voltage regulators (LDOs), interrupt controllers, serial interfaces such as SPI, I²C or universal programmable serial interface, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 210 may be implemented, for example, as a solder-down substrate including one or more integrated circuits, a single packaged integrated circuit soldered to a main circuit board or a multi-chip sub-system including two or more integrated circuits.

In some aspects, memory 220 may include one or more of volatile memory including dynamic random access memory (DRAM) and/or synchronous DRAM (SDRAM), and non-volatile memory (NVM) including high-speed electrically erasable memory (commonly referred to as Flash memory), phase-change random access memory (PRAM), magnetoresistive random access memory (MRAM), and/or a three-dimensional crosspoint memory. Memory 220 may be implemented as one or more of solder down packaged integrated circuits, socketed memory modules and plug-in memory cards.

In some aspects, power management integrated circuitry 225 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 230 may provide for electrical power drawn from a network cable. Power tee circuitry 230 may provide both power supply and data connectivity to the base station radio head 200 using a single cable.

In some aspects, network controller 235 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver 245 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 245 may provide, to application processor 205, data which may include one or more of position data or time data. Time data may be used by application processor 205 to synchronize operations with other radio base stations or infrastructure equipment.

In some aspects, user interface 250 may include one or more of buttons. The buttons may include a reset button. User interface 250 may also include one or more indicators such as LEDs and a display screen.

Figure 3A:
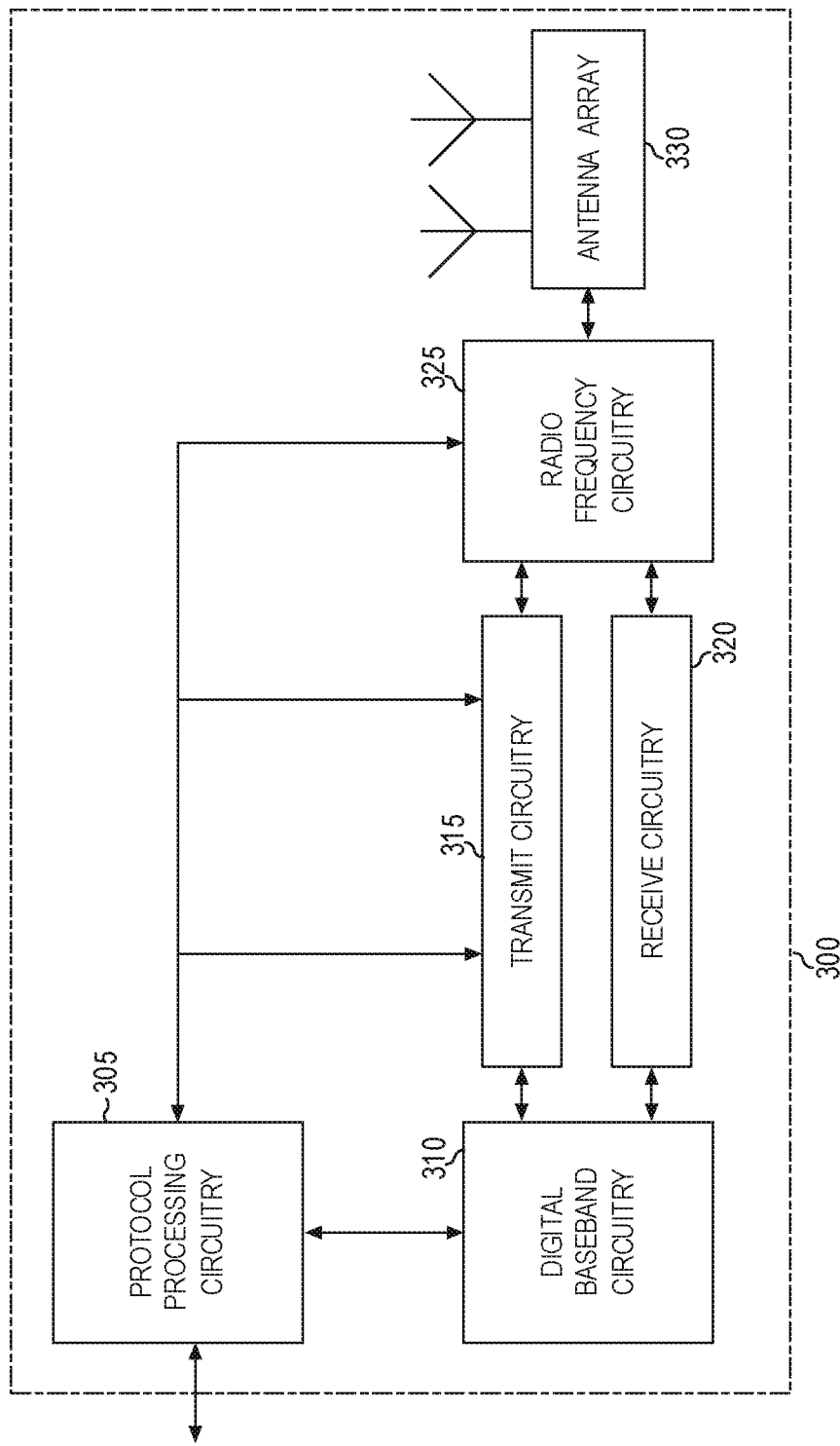
FIG. 3A illustrates exemplary millimeter wave communication circuitry according to some aspects.
Figure 3B:
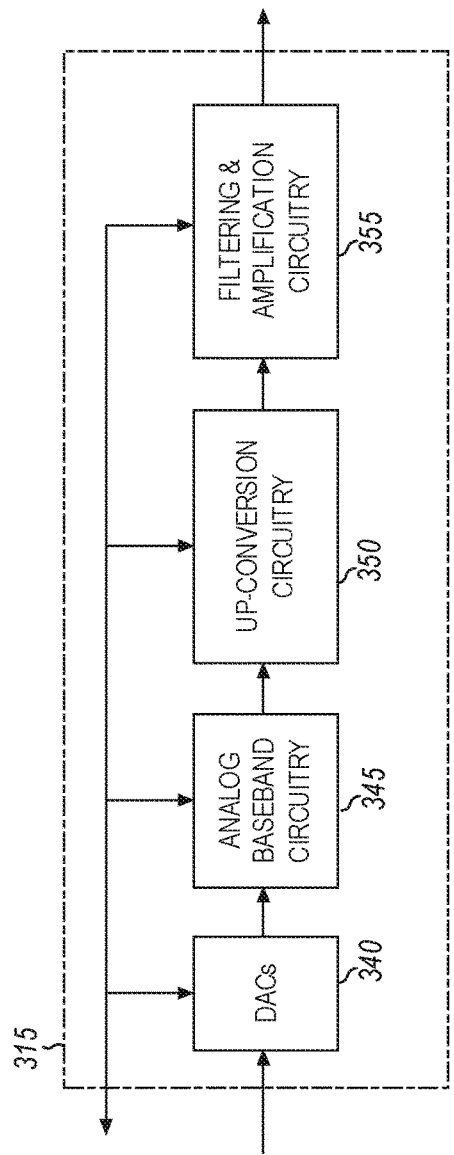
FIG. 3C illustrates aspects of exemplary transmit circuitry illustrated in FIG. 3A according to some aspects.
FIG. 3D illustrates aspects of exemplary radio frequency circuitry illustrated in FIG. 3A according to some aspects.
FIG. 3E illustrates aspects of exemplary receive circuitry in FIG. 3A according to some aspects.
Figure 3C:
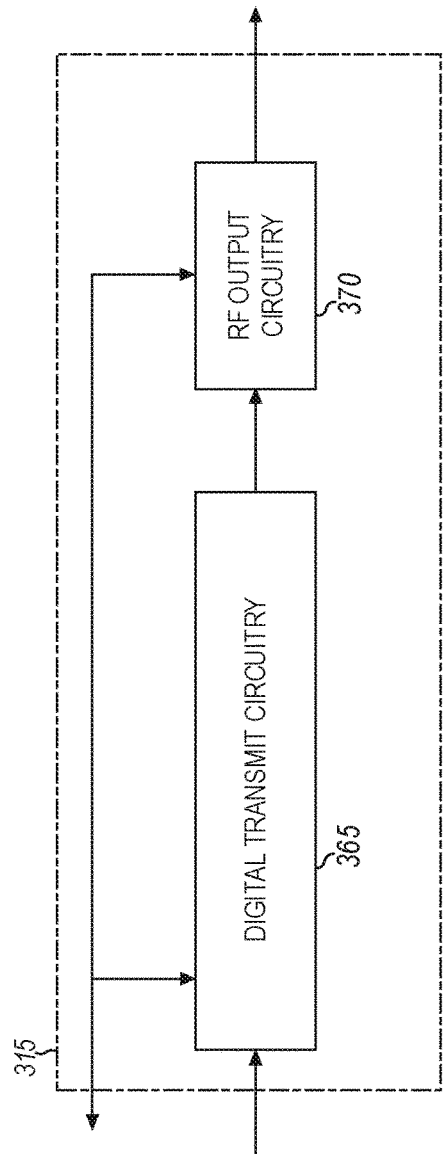
Figure 3D:
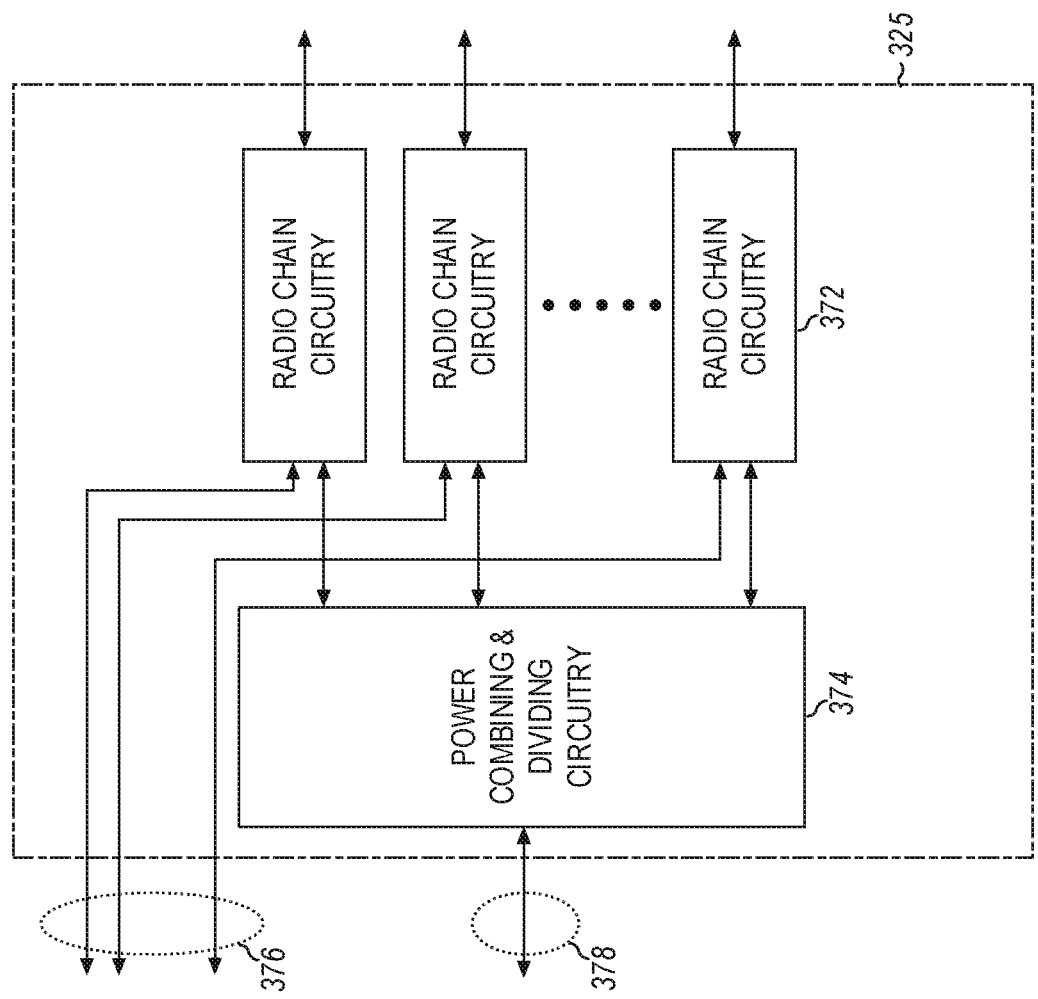
Figure 3E:
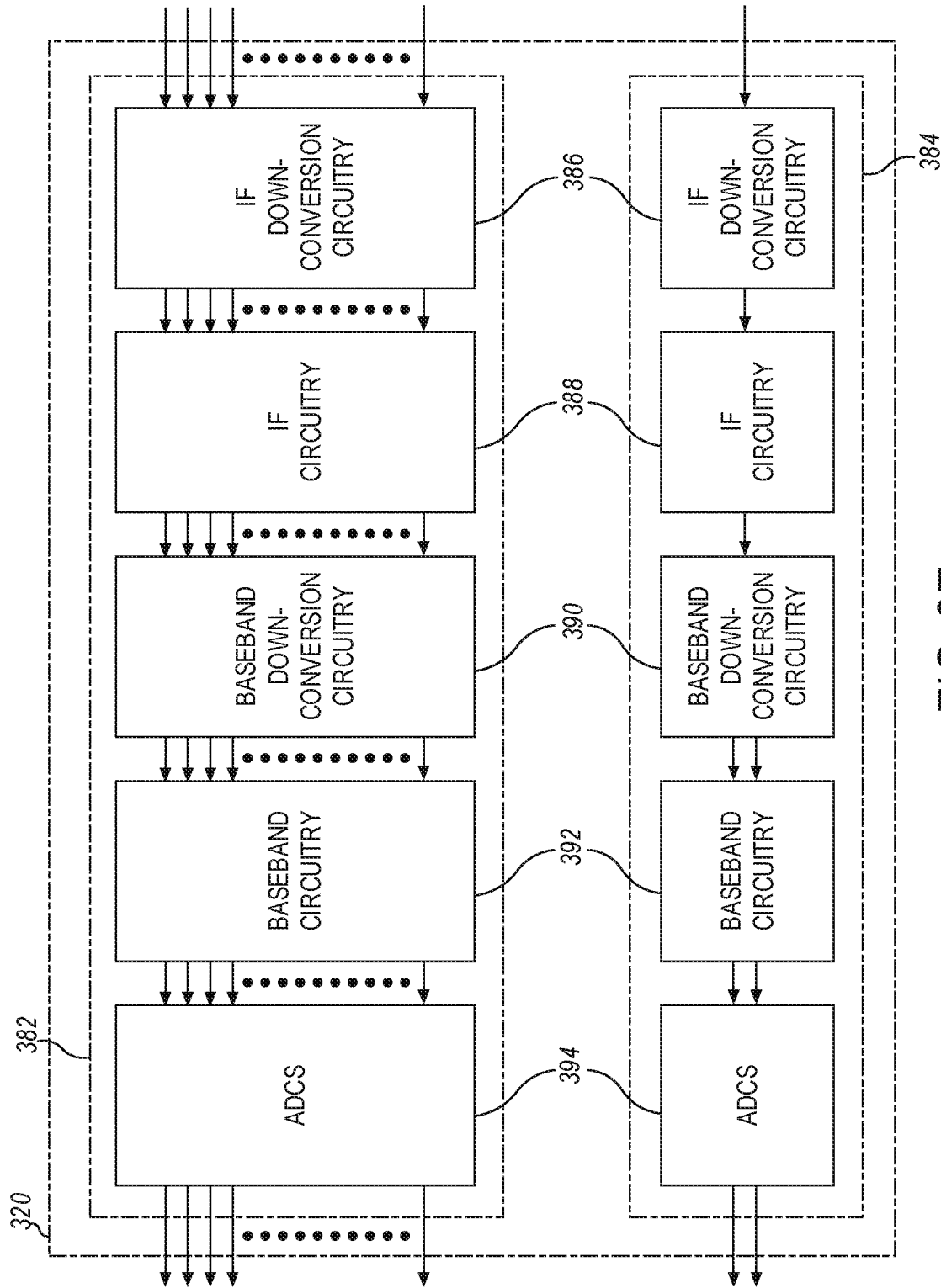

FIG. 3A illustrates exemplary mmWave communication circuitry according to some aspects; FIGS. 3B and 3C illustrate aspects of transmit circuitry shown in FIG. 3A according to some aspects; FIG. 3D illustrates aspects of radio frequency circuitry shown in FIG. 3A according to some aspects; FIG. 3E illustrates aspects of receive circuitry in FIG. 3A according to some aspects. Millimeter wave communication circuitry 300 shown in FIG. 3A may be alternatively grouped according to functions. Components illustrated in FIG. 3A are provided here for illustrative purposes and may include other components not shown in FIG. 3A.

Millimeter wave communication circuitry 300 may include protocol processing circuitry 305 (or processor) or other means for processing. Protocol processing circuitry 305 may implement one or more of medium access control (MAC), radio link control (RLC), packet data convergence protocol (PDCP), radio resource control (RRC) and non-access stratum (NAS) functions, among others. Protocol processing circuitry 305 may include one or more processing cores to execute instructions and one or more memory structures to store program and data information.

Millimeter wave communication circuitry 300 may further include digital baseband circuitry 310. Digital baseband circuitry 310 may implement physical layer (PHY) functions including one or more of hybrid automatic repeat request (HARQ) functions, scrambling and/or descrambling, coding and/or decoding, layer mapping and/or de-mapping, modulation symbol mapping, received symbol and/or bit metric determination, multi-antenna port pre-coding and/or decoding which may include one or more of space-time, space-frequency or spatial coding, reference signal generation and/or detection, preamble sequence generation and/or decoding, synchronization sequence generation and/or detection, control channel signal blind decoding, and other related functions.

Millimeter wave communication circuitry 300 may further include transmit circuitry 315, receive circuitry 320 and/or antenna array circuitry 330. Millimeter wave communication circuitry 300 may further include RF circuitry 325. In some aspects, RF circuitry 325 may include one or multiple parallel RF chains for transmission and/or reception. Each of the RF chains may be connected to one or more antennas of antenna array circuitry 330.

In some aspects, protocol processing circuitry 305 may include one or more instances of control circuitry. The control circuitry may provide control functions for one or more of digital baseband circuitry 310, transmit circuitry 315, receive circuitry 320, and/or RF circuitry 325.

FIGS. 3B and 3C illustrate aspects of transmit circuitry shown in FIG. 3A according to some aspects. Transmit circuitry 315 shown in FIG. 3B may include one or more of digital to analog converters (DACs) 340, analog baseband circuitry 345, up-conversion circuitry 350 and/or filtering and amplification circuitry 355. DACs 340 may convert digital signals into analog signals. Analog baseband circuitry 345 may perform multiple functions as indicated below. Up-conversion circuitry 350 may up-convert baseband signals from analog baseband circuitry 345 to RF frequencies (e.g., mmWave frequencies). Filtering and amplification circuitry 355 may filter and amplify analog signals. Control signals may be supplied between protocol processing circuitry 305 and one or more of DACs 340, analog baseband circuitry 345, up-conversion circuitry 350 and/or filtering and amplification circuitry 355.

Transmit circuitry 315 shown in FIG. 3C may include digital transmit circuitry 365 and RF circuitry 370. In some aspects, signals from filtering and amplification circuitry 355 may be provided to digital transmit circuitry 365. As above, control signals may be supplied between protocol processing circuitry 305 and one or more of digital transmit circuitry 365 and RF circuitry 370.

FIG. 3D illustrates aspects of radio frequency circuitry shown in FIG. 3A according to some aspects. Radio frequency circuitry 325 may include one or more instances of radio chain circuitry 372, which in some aspects may include one or more filters, power amplifiers, low noise amplifiers, programmable phase shifters and power supplies.

Radio frequency circuitry 325 may also in some aspects include power combining and dividing circuitry 374. In some aspects, power combining and dividing circuitry 374 may operate bidirectionally, such that the same physical circuitry may be configured to operate as a power divider when the device is transmitting, and as a power combiner when the device is receiving. In some aspects, power combining and dividing circuitry 374 may include one or more wholly or partially separate circuitries to perform power dividing when the device is transmitting and power combining when the device is receiving. In some aspects, power combining and dividing circuitry 374 may include passive circuitry including one or more two-way power divider/combiners arranged in a tree. In some aspects, power combining and dividing circuitry 374 may include active circuitry including amplifier circuits.

In some aspects, radio frequency circuitry 325 may connect to transmit circuitry 315 and receive circuitry 320 in FIG. 3A. Radio frequency circuitry 325 may connect to transmit circuitry 315 and receive circuitry 320 via one or more radio chain interfaces 376 and/or a combined radio chain interface 378. In some aspects, one or more radio chain interfaces 376 may provide one or more interfaces to one or more receive or transmit signals, each associated with a single antenna structure. In some aspects, the combined radio chain interface 378 may provide a single interface to one or more receive or transmit signals, each associated with a group of antenna structures.

FIG. 3E illustrates aspects of receive circuitry in FIG. 3A according to some aspects. Receive circuitry 320 may include one or more of parallel receive circuitry 382 and/or one or more of combined receive circuitry 384. In some aspects, the one or more parallel receive circuitry 382 and one or more combined receive circuitry 384 may include one or more intermediate Frequency (IF) down-conversion circuitry 386, IF processing circuitry 388, baseband down-conversion circuitry 390, baseband processing circuitry 392 and analog-to-digital converter (ADC) circuitry 394. As used herein, the term "intermediate frequency" refers to a frequency to which a carrier frequency (or a frequency signal) is shifted as in intermediate step in transmission, reception, and/or signal processing. IF down-conversion circuitry 386 may convert received RF signals to IF. IF processing circuitry 388 may process the IF signals, e.g., via filtering and amplification. Baseband down-conversion circuitry 390 may convert the signals from IF processing circuitry 388 to baseband. Baseband processing circuitry 392 may process the baseband signals, e.g., via filtering and amplification. ADC circuitry 394 may convert the processed analog baseband signals to digital signals.

Figure 4:
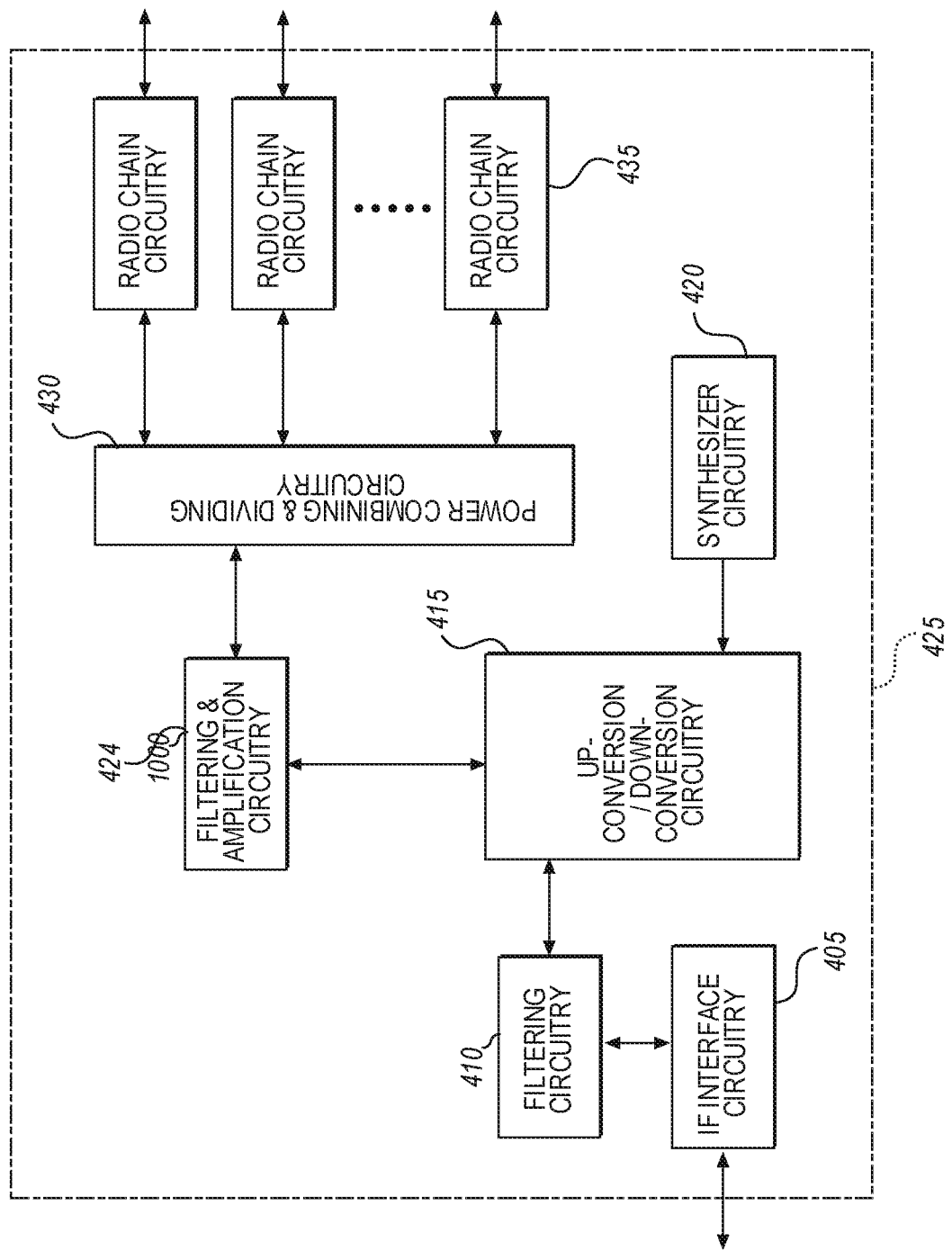
FIG. 4 illustrates exemplary useable RF circuitry in FIG. 3A according to some aspects.

FIG. 4 illustrates exemplary RF circuitry of FIG. 3A according to some aspects. In an aspect, RF circuitry 325 in FIG. 3A (depicted in FIG. 4 using reference number 425) may include one or more of the IF interface circuitry 405, filtering circuitry 410, up-conversion and down-conversion circuitry 415, synthesizer circuitry 420, filtering and amplification circuitry 424, power combining and dividing circuitry 430, and radio chain circuitry 435.

Figure 5B:
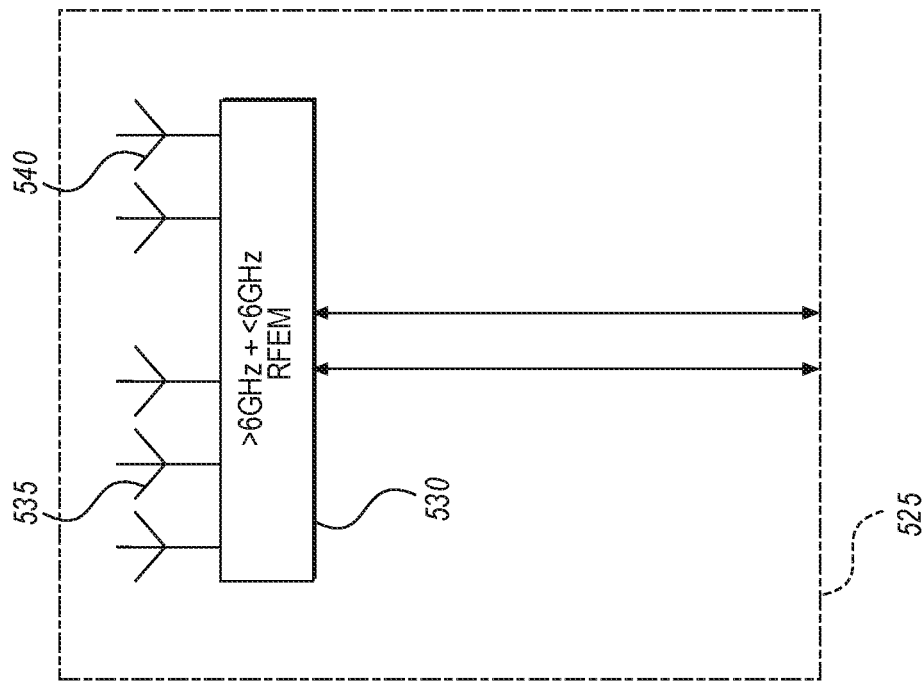
FIG. 5B illustrates an alternate aspect of an exemplary radio front end module, according to some aspects.
Figure 5A:
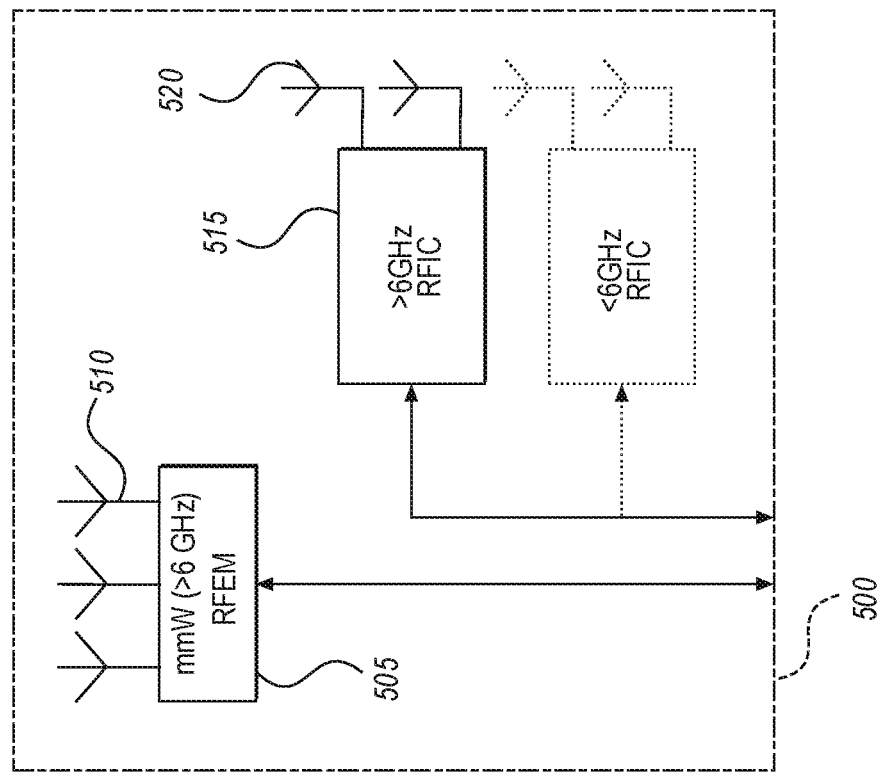
FIG. 5A illustrates an aspect of an exemplary radio front end module (RFEM) according to some aspects.

FIG. 5A and FIG. 5B illustrate aspects of a radio front end module useable in the circuitry shown in FIG. 1 and FIG. 2, according to some aspects. FIG. 5A illustrates an aspect of a radio front end module (RFEM) according to some aspects. RFEM 500 incorporates a millimeter wave RFEM 505 and one or more above-six gigahertz radio frequency integrated circuits (RFIC) 515 and/or one or more sub-six gigahertz RFICs 522. In this aspect, the one or more sub-six gigahertz RFICs 515 and/or one or more sub-six gigahertz RFICs 522 may be physically separated from millimeter wave RFEM 505. RFICs 515 and 522 may include connection to one or more antennas 520. RFEM 505 may include multiple antennas 510.

FIG. 5B illustrates an alternate aspect of a radio front end module, according to some aspects. In this aspect both millimeter wave and sub-six gigahertz radio functions may be implemented in the same physical radio front end module (RFEM) 530. RFEM 530 may incorporate both millimeter wave antennas 535 and sub-six gigahertz antennas 540.

Figure 6:
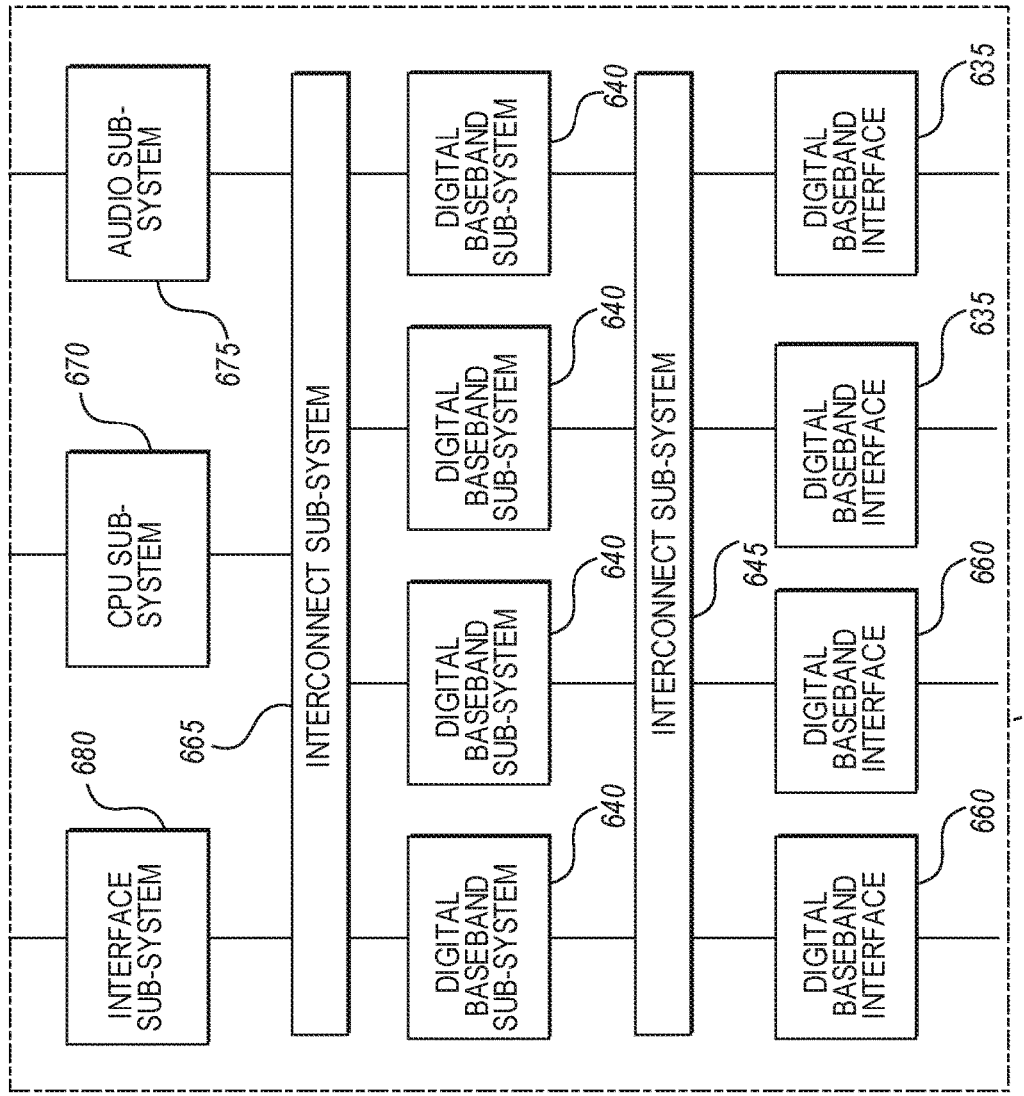
FIG. 6 illustrates an exemplary multi-protocol baseband processor useable in FIG. 1 or FIG. 2, according to some aspects.

FIG. 6 illustrates a multi-protocol baseband processor 600 useable in the system and circuitry shown in FIG. 1 or FIG. 2, according to some aspects. In an aspect, baseband processor may contain one or more digital baseband subsystems 640A, 640B, 640C, 640D, also herein referred to collectively as digital baseband subsystems 640.

In an aspect, the one or more digital baseband subsystems 640A, 640B, 640C, 640D may be coupled via interconnect subsystem 665 to one or more of CPU subsystem 670, audio subsystem 675 and interface subsystem 680. In an aspect, the one or more digital baseband subsystems 640 may be coupled via interconnect subsystem 645 to one or more of each of digital baseband interface 660A, 660B and mixed-signal baseband subsystem 635A, 635B.

In an aspect, interconnect subsystem 665 and 645 may each include one or more of each of buses point-to-point connections and network-on-chip (NOC) structures. In an aspect, audio subsystem 675 may include one or more of digital signal processing circuitry, buffer memory, program memory, speech processing accelerator circuitry, data converter circuitry such as analog-to-digital and digital-to-analog converter circuitry, and analog circuitry including one or more of amplifiers and filters.

Figure 7:
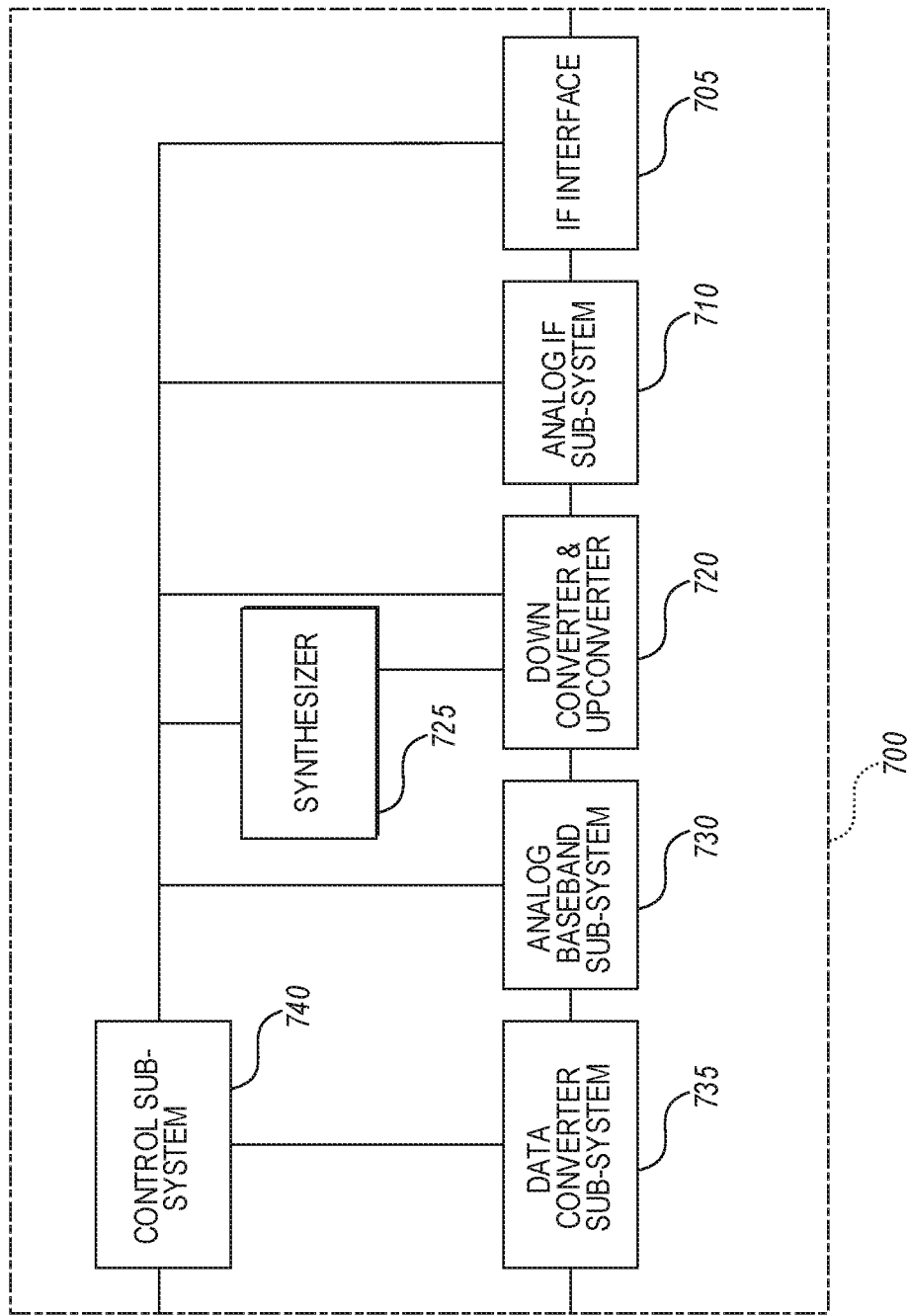
FIG. 7 illustrates an exemplary mixed signal baseband subsystem, according to some aspects.

FIG. 7 illustrates an exemplary of a mixed signal baseband subsystem 700, according to some aspects. In an aspect, mixed signal baseband subsystem 700 may include one or more of IF interface 705, analog IF subsystem 710, down-converter and up-converter subsystem 720, analog baseband subsystem 730, data converter subsystem 735, synthesizer 725 and control subsystem 740.

Figure 8A:
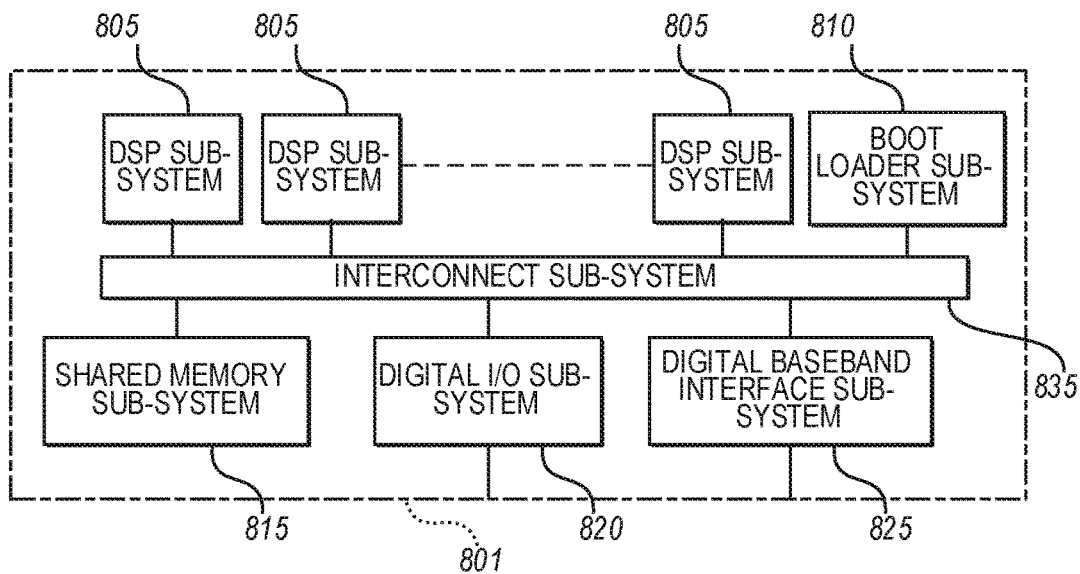
FIG. 8A illustrates an exemplary digital baseband subsystem, according to some aspects.
Figure 8B:
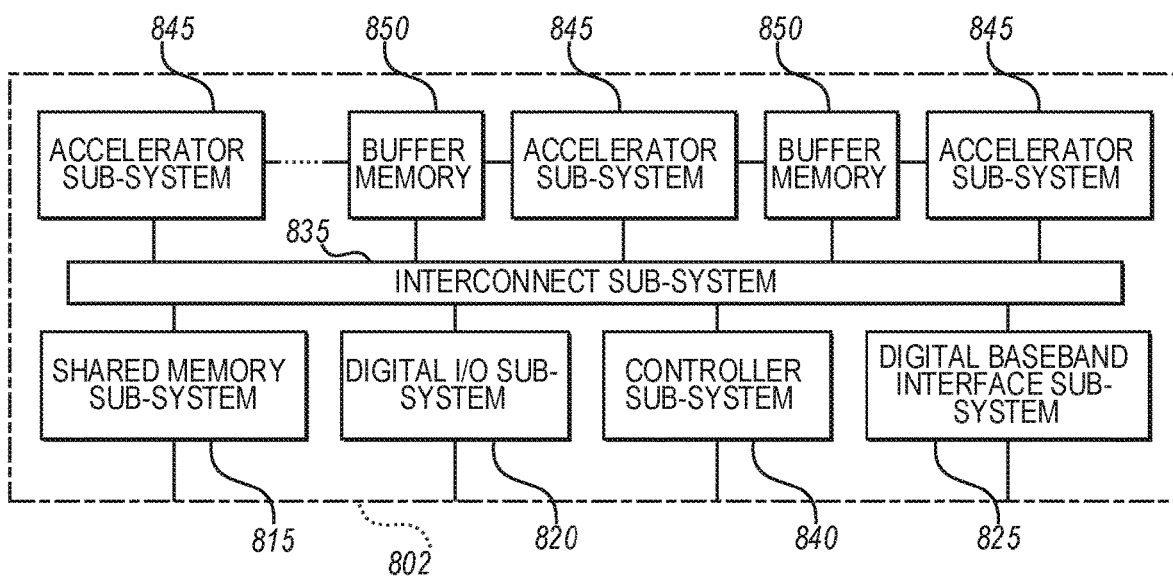
FIG. 8B illustrates an alternate aspect of an exemplary baseband processing subsystem, according to some aspects.

FIG. 8A illustrates a digital baseband processing subsystem 801, according to some aspects. FIG. 8B illustrates an alternate aspect of a digital baseband processing subsystem 802, according to some aspects.

In an aspect of FIG. 8A, the digital baseband processing subsystem 801 may include one or more of each of digital signal processor (DSP) subsystems 805A, 805B, . . . 805N, interconnect subsystem 835, boot loader subsystem 810, shared memory subsystem 815, digital I/O subsystem 820, and digital baseband interface subsystem 825.

In an aspect of FIG. 8B, digital baseband processing subsystem 802 may include one or more of each of accelerator subsystem 845A, 845B, . . . 845N, buffer memory 850A, 850B, . . . 850N, interconnect subsystem 835, shared memory subsystem 815, digital I/O subsystem 820, controller subsystem 840 and digital baseband interface subsystem 825.

In an aspect, boot loader subsystem 810 may include digital logic circuitry configured to perform configuration of the program memory and running state associated with each of the one or more DSP subsystems 805. Configuration of the program memory of each of the one or more DSP subsystems 805 may include loading executable program code from storage external to digital baseband processing subsystems 801 and 802. Configuration of the running state associated with each of the one or more DSP subsystems 805 may include one or more of the steps of: setting the state of at least one DSP core which may be incorporated into each of the one or more DSP subsystems 805 to a state in which it is not running, and setting the state of at least one DSP core which may be incorporated into each of the one or more DSP subsystems 805 into a state in which it begins executing program code starting from a predefined memory location.

In an aspect, shared memory subsystem 815 may include one or more of read-only memory (ROM), static random access memory (SRAM), embedded dynamic random access memory (eDRAM) and/or non-volatile random access memory (NVRAM).

In an aspect, digital I/O subsystem 820 may include one or more of serial interfaces such as Inter-Integrated Circuit (I²C), Serial Peripheral interface (SPI) or other 1, 2 or 3-wire serial interfaces, parallel interfaces such as general-purpose input-output (GPIO), register access interfaces and direct memory access (DMA). In an aspect, a register access interface implemented in digital I/O subsystem 820 may permit a microprocessor core external to digital baseband processing subsystem 801 to read and/or write one or more of control and data registers and memory. In an aspect, DMA logic circuitry implemented in digital I/O subsystem 820 may permit transfer of contiguous blocks of data between memory locations including memory locations internal and external to digital baseband processing subsystem 801.

In an aspect, digital baseband interface subsystem 825 may provide for the transfer of digital baseband samples between baseband processing subsystem and mixed signal baseband or radio-frequency circuitry external to digital baseband processing subsystem 801. In an aspect, digital baseband samples transferred by digital baseband interface subsystem 825 may include in-phase and quadrature (I/Q) samples.

In an aspect, controller subsystem 840 may include one or more of each of control and status registers and control state machines. In an aspect, control and status registers may be accessed via a register interface and may provide for one or more of starting and stopping operation of control state machines, resetting control state machines to a default state, configuring optional processing features, and/or configuring the generation of interrupts and reporting the status of operations. In an aspect, each of the one or more control state machines may control the sequence of operation of each of the one or more accelerator subsystems 845. There may be examples of implementations of both FIG. 8A and FIG. 8B in the same baseband subsystem.

Figure 9:
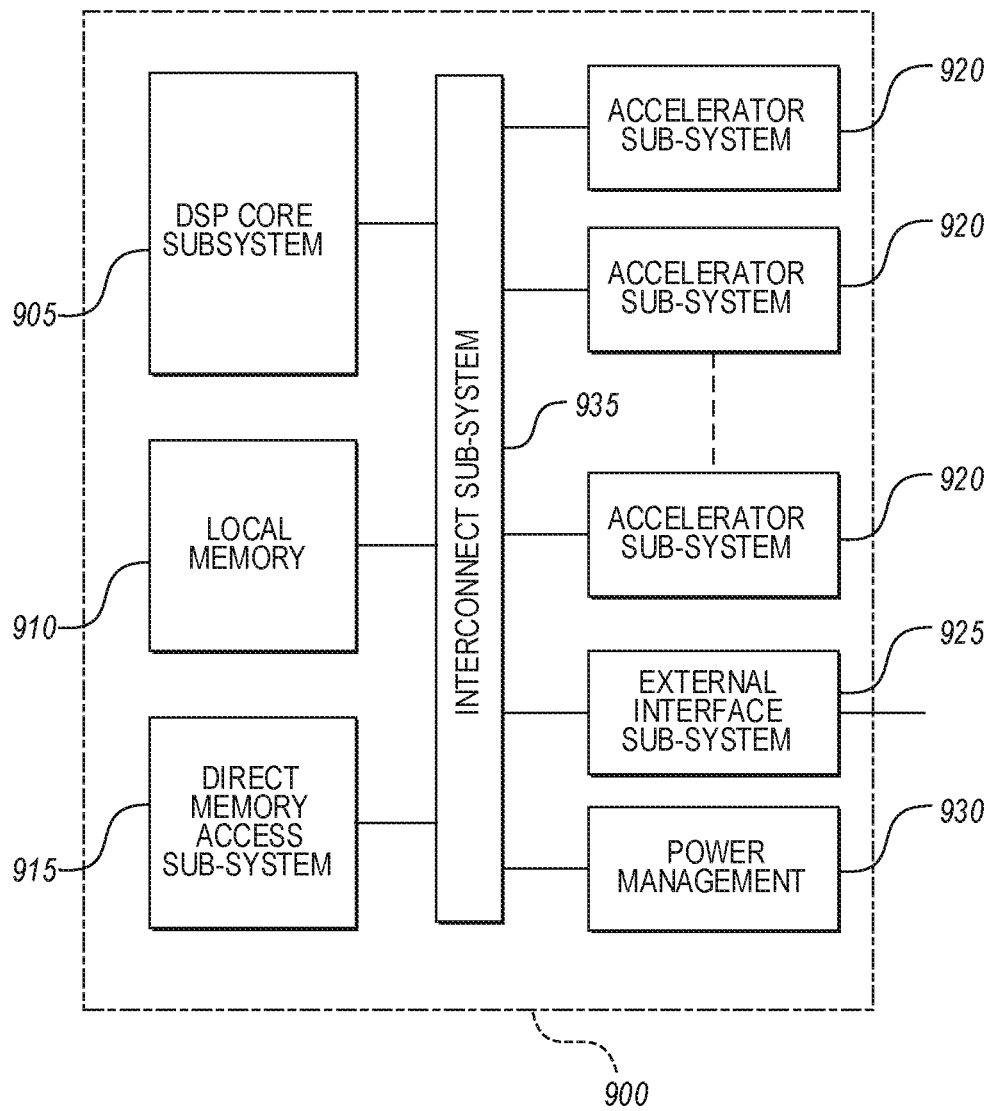
FIG. 9 illustrates an exemplary digital signal processor subsystem, according to some aspects.

FIG. 9 illustrates a digital signal processor (DSP) subsystem 900 according to some aspects.

In an aspect, DSP subsystem 900 may include one or more of each of DSP core subsystem 905, local memory 910, direct memory access (DMA) subsystem 915, accelerator subsystem 920A, 920B . . . 920N, external interface subsystem 925, power management circuitry 930 and interconnect subsystem 935.

In an aspect, local memory 910 may include one or more of each of read-only memory, static random access memory or embedded dynamic random access memory.

In an aspect, the DMA subsystem 915 may provide registers and control state machine circuitry adapted to transfer blocks of data between memory locations including memory locations internal and external to DSP subsystem 900.

In an aspect, external interface subsystem 925 may provide for access by a microprocessor system external to DSP subsystem 900 to one or more of memory, control registers and status registers which may be implemented in DSP subsystem 900. In an aspect, external interface subsystem 925 may provide for transfer of data between local memory 910 and storage external to DSP subsystem 900 under the control of one or more of the DMA subsystem 915 and the DSP core subsystem 905.

Figure 10A:
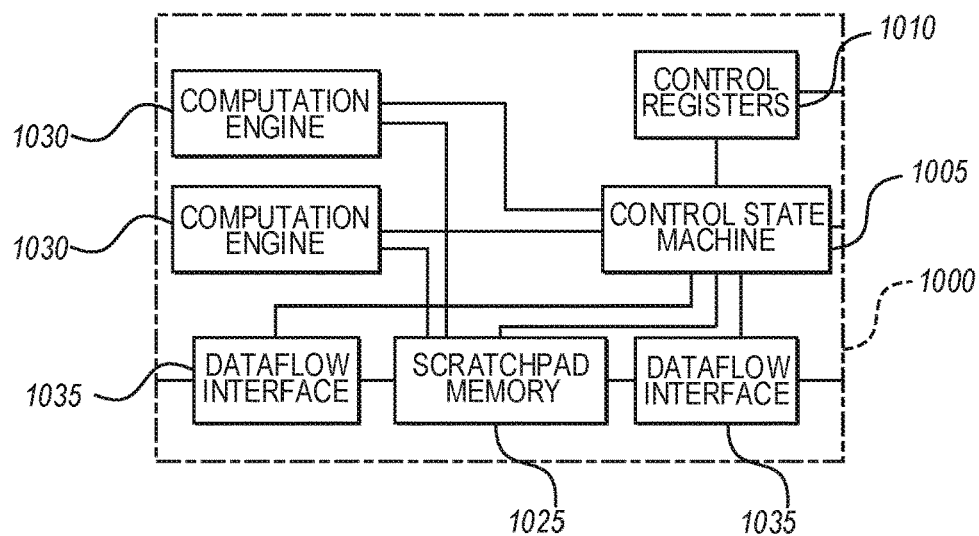
FIG. 10A illustrates an example of an accelerator subsystem, according to some aspects.
Figure 10B:
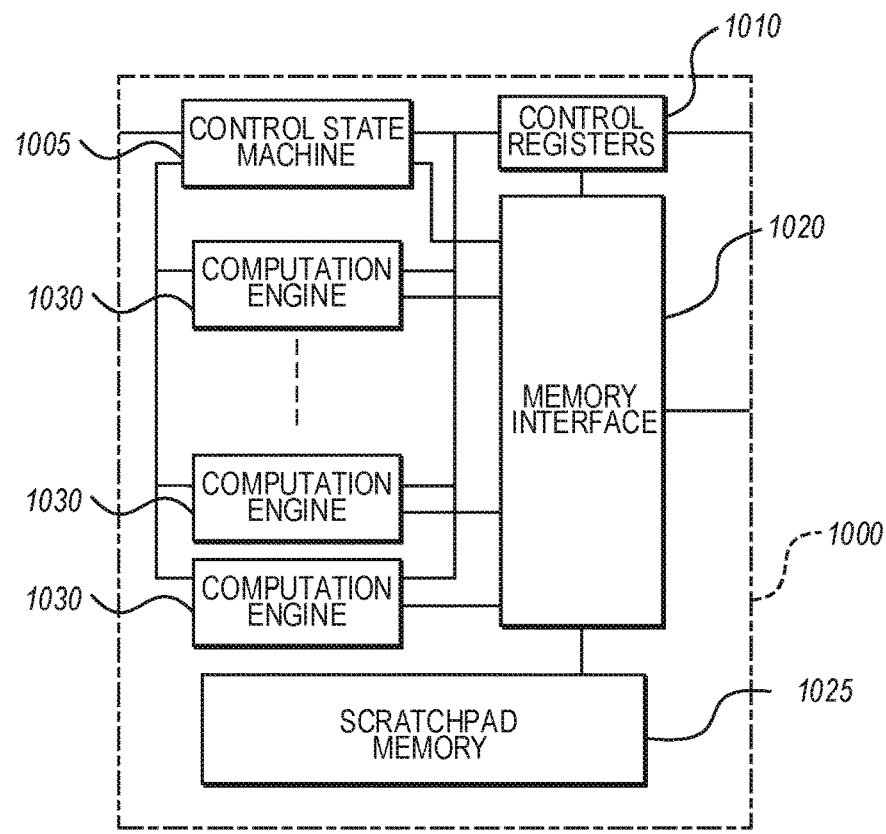
FIG. 10B illustrates an alternate exemplary accelerator subsystem, according to some aspects.

FIG. 10A illustrates an example of an accelerator subsystem 1000 according to some aspects. FIG. 10B illustrates an example of an accelerator subsystem 1000 according to some aspects.

In an aspect, accelerator subsystem 1000 may include one or more of each of control state machine 1005, control registers 1010, memory interface 1020, scratchpad memory 1025, computation engine 1030A . . . 1030N and dataflow interface 1035A, 1035B.

In an aspect, control registers 1010 may configure and control the operation of accelerator subsystem 1000, which may include one or more of enabling or disabling operation by means of an enable register bit, halting an in-process operation by writing to a halt register bit, providing parameters to configure computation operations, providing memory address information to identify the location of one or more control and data structures, configuring the generation of interrupts, or other control functions.

In an aspect, control state machine 1005 may control the sequence of operation of accelerator subsystem 1000.

Envelope Tracking Operations with Autonomous Power Reduction

In some aspects, envelope tracking may involve modulating a supply voltage (Vcc) (e.g., battery voltage) to a power amplifier (PA) to match an envelope of an RF signal (e.g., to match an input signal to the PA). As further described in more detail below, a device such as an envelope tracking integrated circuit (ETIC) (e.g., tracker) may be configured to modulate the supply voltage of the PA to match an envelope of the RF signal.

In some aspects, an ETIC may take an envelope signal waveform (e.g., amplitude and phase) and post-process the envelope signal waveform in a way to maximize the efficiency of the supply voltage to the PA. In some aspects, the result of such post-processing is an Envelope Tracking (ET) Lookup-Table (LUT) (e.g., shaping function, LUT function). In certain aspects, post-processing may involve taking an amplitude of a RF signal (e.g., input signal amplitude to a PA) and applying a LUT function (e.g., shaping function) to transform the signal for a supply voltage value. As a result, the supply voltage may not reach a zero value, even if it reaches very low input signal levels to a PA. For example, as opposed to reaching a zero value, a supply voltage to the PA may asymptote to a certain minimum voltage level. As a result, the PA may behave as if it has constant gain at lower signal levels (e.g., lower input signal amplitudes to the PA). In some cases, frequency dispersion may affect PA load lines across a frequency band and may limit an available power as the LUT function exceeds a calibrated maximum voltage value ($V_{max}$). This can be further degraded by high output loss, high temperature and voltage standing wave ratio (VSWR).

In some aspects, it may be advantageous to adapt the LUT to improve an AM-AM gain (e.g., RF gain) flatness, adjacent channel leakage ratio (ACLR,) and error vector magnitude (EVM) margins for the PA. An ET Closed-Loop (ET CL) operation may automatically update a slope value of a LUT to achieve an optimal slope value. In certain aspects, the ET CL operation may be implemented in hardware and/or firmware to adapt a LUT to improve AM-ANI gain flatness and give higher margins for ACLR and EVM. In some aspects, the ET CL operation may include operating on live data, for example, in response to any perturbation in ET operation affecting AM-AM gain flatness over power that may occur throughout a life of a radio. In some aspects, the ET CL operation may quickly adapt a less than optimal initial setting for a LUT, making onerous factory characterizations for features optional, and if done less critical.

In some aspects, linear output power in ET is limited by a maximum supply voltage allowed by a LUT function (e.g., shaping table). A device (e.g., device 100, device 1600) may perform an Autonomous Power Reduction (APR) operation, as described further below, to limit a target output power $P_{out}$ of a PA to a specified level (PAR_min) below a corresponding point of a maximum supply voltage $V_{cc}$. In some aspects, a minimum peak-to-average ratio (PAR_min) may be predetermined (e.g., 5 dB) and adjusted for a certain modulation and coding scheme (MCS) and/or coded modulation (CM). In certain aspects, the device may parameterize and quickly reconfigure the LUT function through APR.

In other aspects, the device may apply a soft ET operation to modify parameters of the LUT function, as further described below, into a new LUT (e.g., shaping function, LUT function). In some aspects, the device may algebraically modify the parameters of the LUT function into a new LUT with different behavior in a specific way, for example, according to a new set of operating conditions of the PA (e.g., ambient temperature of the PA, operating frequency, and bandwidth of a signal for transmission from the PA).

Figure 11:
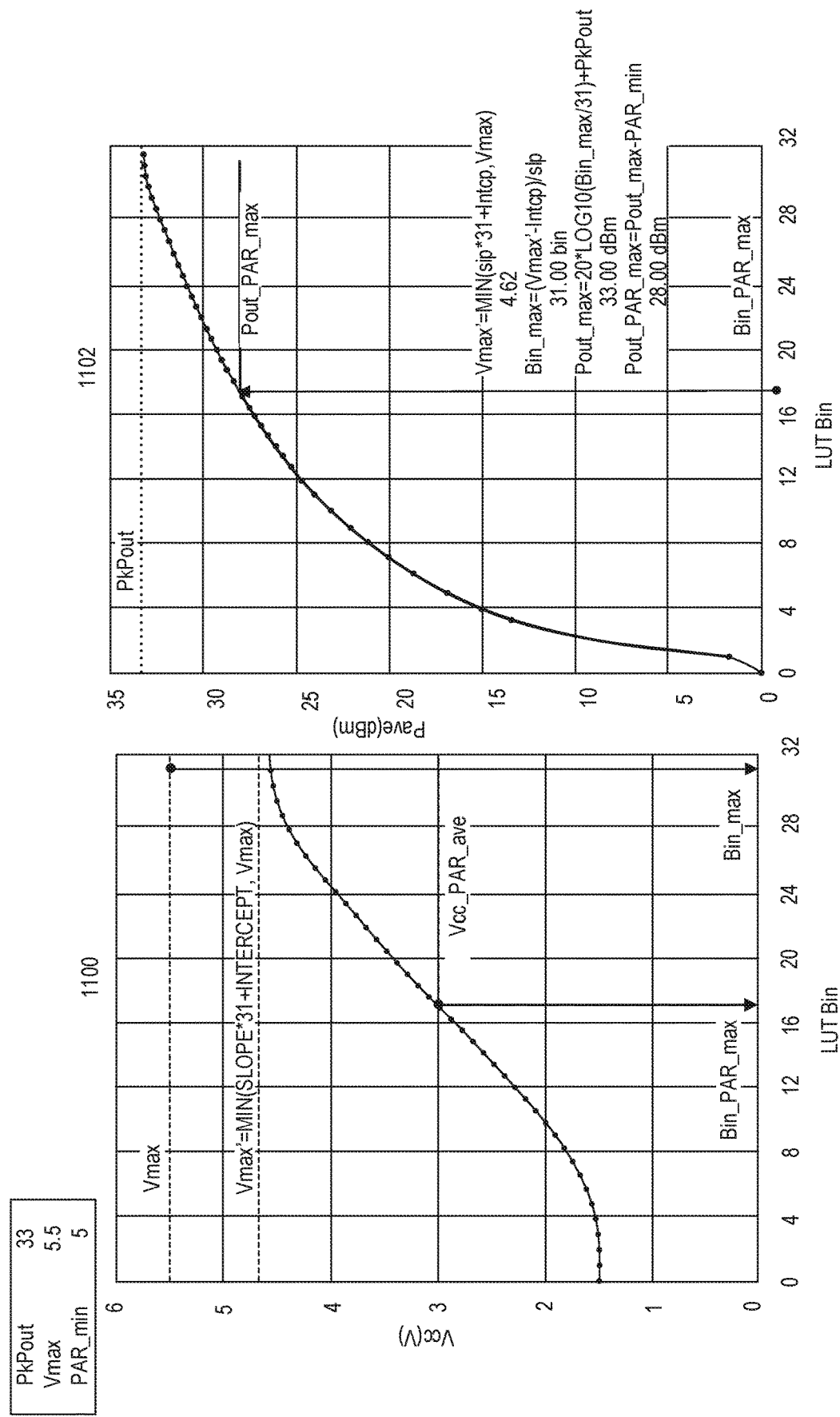
FIG. 11 illustrates graphs of an exemplary look-up table (LUT), in accordance with certain aspects.

FIG. 11 illustrates graphs of an exemplary look-up table (LUT), in accordance with certain aspects. In some aspects, graph 1100 represents an exemplary LUT function (e.g., shaping function) of a LUT. Graph 1102 illustrates, in certain aspects, a peak output power ($P_k P_{out}$) of the LUT (e.g., in dBm) limiting an output power ($P_{out}$) of a PA. In some aspects, graphs 1100 and 1102 characterize a normal (e.g., non-lossy) LUT with x-axis values (LUT Bin) representing an input signal (e.g., amplitude) to a PA, for example, the PA described below with respect to FIGS. 13 and 14. The y-axis values of graph 1100 represent a supply voltage $V_{cc}$ (V) to the PA, and the y-axis values of graph 1102 represent an average power $P_{ave}$ (dBm) of the PA. In some aspects, a LUT may have a fixed number of entries (e.g., 32), an index to each of those entries may correspond to a power level or an amplitude level of the signal, and the output may be a signal proportional to the supply voltage to the PA (e.g., a value in a specific bin).

In graph 1100, for example, the LUT function illustrates entries of a LUT and includes a particular slope, a maximum voltage $V_{max}$, a minimum voltage $V_{min}$, Bin corresponding to a peak to average ratio (PAR) maximum, Bin maximum, and y-intercept of the slope with a maximum voltage $V_{max}$ of a power supply. In certain aspects, $V_{max'}$ (e.g., $V_{max'}$=min (slope*31+intercept, $V_{max}$) represents a point at which any power supply voltage greater than $V_{max'}$ results in a voltage saturated region of the PA (e.g., gain compression). Graph 1100 illustrates that at low amplitudes, a small signal gain region (e.g., straight-lined slope) of the LUT function may asymptote to a fixed minimum voltage, and as voltage is increased, the small signal gain region may asymptote to a gain compression region. In some aspects, the LUT function 1100 may represent a function and/or algorithm used by a device (e.g., device 100, device 1600), for example, including the transceiver 1300 of FIGS. 13 and 14, as described in more detail below.

Figure 12:
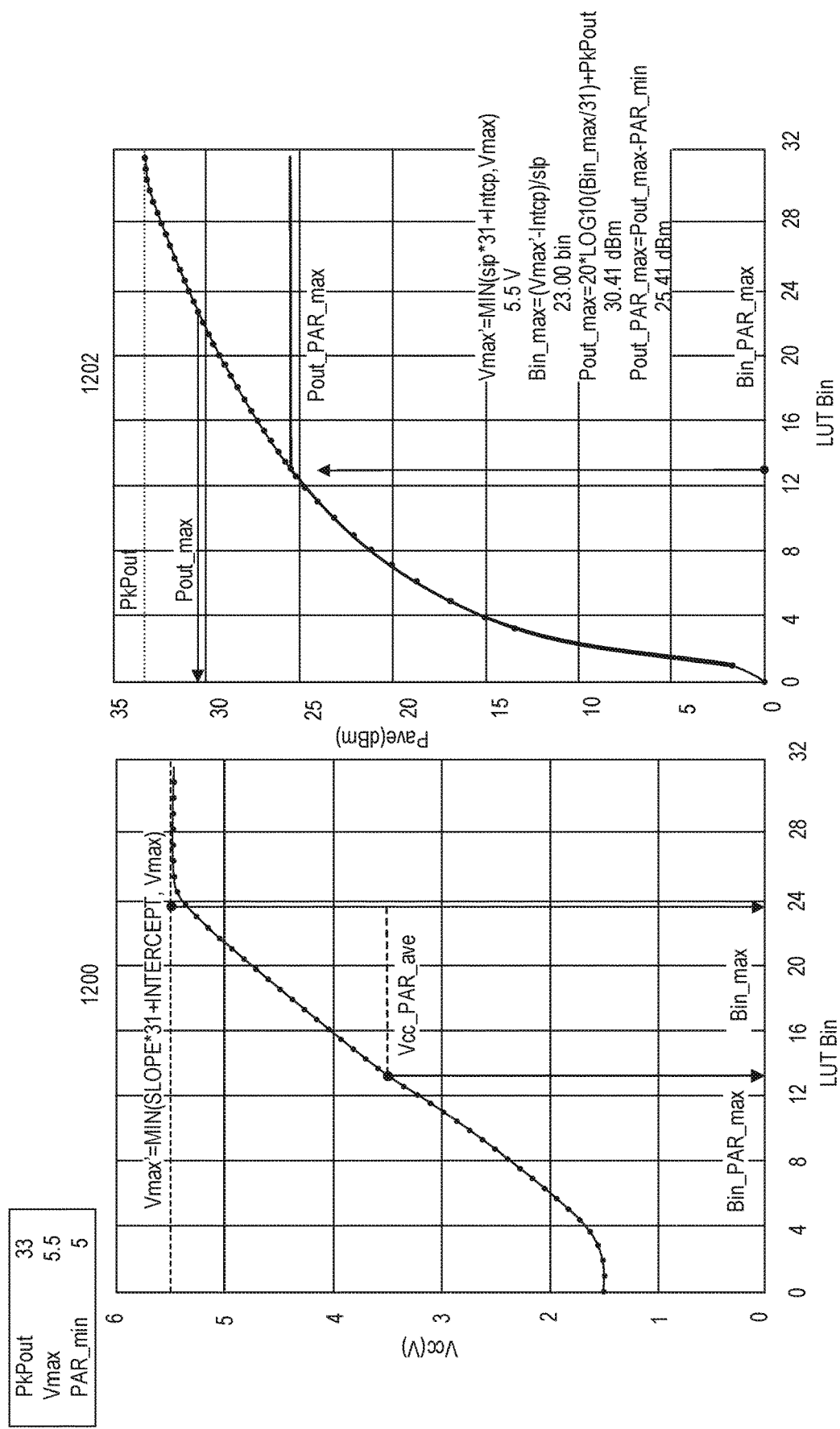
FIG. 12 illustrates graphs of an exemplary LUT, in accordance with certain aspects.

FIG. 12 illustrates graphs of an exemplary LUT, in accordance with certain aspects. Similar to graph 1100 of FIG. 11, graph 1200 represents an exemplary LUT function (e.g., shaping function) of a LUT. Similar to graph 1102 in FIG. 11, graph 1202 illustrates, in certain aspects, a peak output power ($P_k P_{out}$) of the LUT (e.g., in dBm) limiting an output power ($P_{out}$) of a PA. In some aspects, graphs 1200 and 1202 characterize a lossy LUT with x-axis values (LUT Bin) representing an input signal (e.g., amplitude) to a PA, for example, the PA described below with respect to FIGS.

13 and 14. For example, the lossy LUT of FIG. 12 may include a maximum supply voltage $V_{max'}$ (e.g., $V_{max'}$=min (slope*31+intercept, $V_{max}$) that occurs at a lower LUT Bin x-axis point compared to the non-lossy LUT of FIG. 11, representing a gain compression region occurring at a lower supply voltage.

Figure 13:
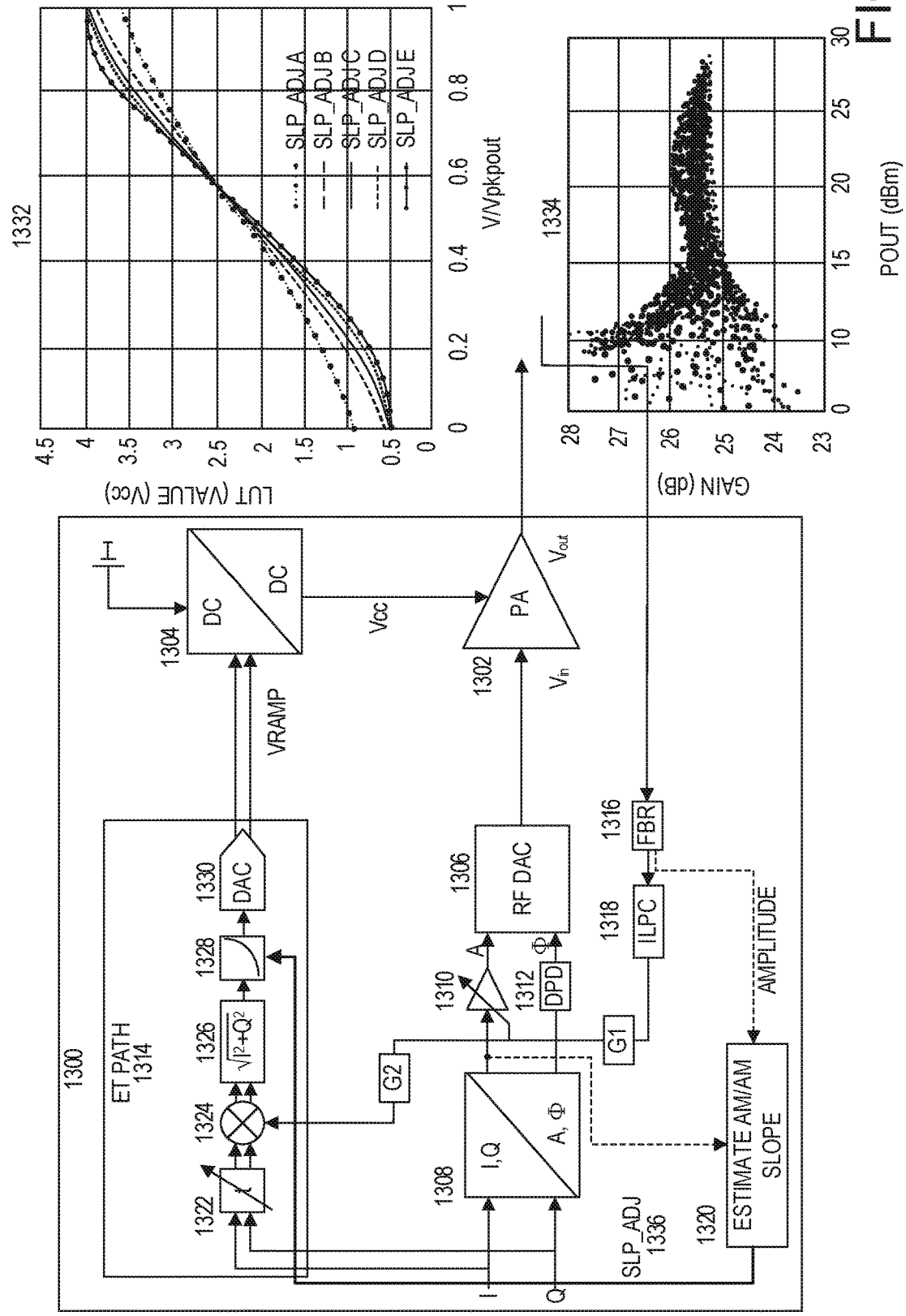
FIG. 13 illustrates an exemplary device for envelope tracking, in accordance with certain aspects.

FIG. 13 illustrates an exemplary device for envelope tracking, in accordance with certain aspects. In certain aspects, the device may be, or may include, a transceiver 1300 configured for digital signal processing on signals for transmission (e.g., from a UE, device 100, device 1600) and on received signals (e.g., received by a UE, device 100, device 1600). In some aspects, the transceiver 1300 may include circuitry configured for any one of the methods described herein, including ET CL and soft ET operations for APR.

In some aspects, the transceiver 1300 may include a power amplifier (PA) 1302, DC/DC converter (DC/DC) (e.g., ETIC) 1304, a RF digital-to-analog converter (RF DAC) 1306, modulation circuitry (e.g., I, Q/A, φ) 1308, gain circuitry 1310 (e.g., G1, G2), delay circuitry 1312, envelope tracking circuitry (e.g., ET Path) 1314, a Feedback Receiver (FBR) 1316, an Inner Loop Power Control (IL PC) 1318, and Slope Estimation circuitry 1320. The ET Path 1314 may include a delay circuitry 1322, a mixer 1324, signal amplitude circuitry 1326, LUT 1328, and a digital-to-analog converter (DAC) 1330.

The DC/DC 1304 may include circuitry to modulate a battery voltage with signaling that is proportional to signaling at the input of the PA 1302, according to the LUT 1328, such that the supply voltage Vcc to the PA 1302 matches an envelope of RF signaling at the output of the RF DAC 1306. In some aspects, the output signaling from the signal amplitude circuitry 1326 may be the same as the input signaling to the RF DAC 1306. In some aspects, as the RF DAC 1306 provides modulated signaling to the input of the PA 1302 for transmission, the ET Path 1314 provides, in parallel, signaling to the DC/DC 1304, which outputs modulated signaling to the power supply terminal of the PA 1302. In certain aspects, the ET Path 1314 and the DC/DC 1304 provide modulated signaling to the power supply terminal of the PA 1302 in real-time, using feedback from the output of the PA 1302, via the FBR 1316, ILPC 1318, and/or the gain circuitry 1310 (e.g., G1, G2).

The transceiver 1300 may be configured to store data defining a plurality of LUT functions (e.g., shaping functions), for example, the transceiver 1300 may be configured to include and/or store the LUT 1328, and the LUT 1328 may include data defining one or more LUT functions similar to the LUT functions of FIGS. 11 and 12. In some aspects, the transceiver 1300 may also be configured to retrieve data defining one or more LUT functions from device memory. In some aspects, in performing an ET Closed-Loop (ET CL) operation, a device (e.g., including the transceiver 1300) may automatically update a slope value of the LUT 1328 to achieve an optimal slope value. For example, the device (e.g., device 100, device 1600) may be configured to receive feedback data indicating a change in one or more operating conditions and/or parameters (e.g., temperature, operating frequency, operating bandwidth) and adjust a modulated output power of the DC/DC 1304 in accordance with the data received, according to parameters of the LUT 1328.

In some aspects, a ET CL operation may be based on the RF feedback data from the FBR 1316. For example, in certain aspects, the FBR 1316 measures output values from the PA 1302 (e.g., RF feedback data), such as RF signal amplitudes and gain values of the PA 1302, and provides this RF feedback data to the ET Path 1314 (e.g., via the ILPC 1318, the slope estimation circuitry 1320, and gain circuitry G1/G2). In some aspects, the slope estimation circuitry 1320 receives RF signal amplitude values from the FBR 1316 and estimates a slope value for a LUT function (e.g., for LUT 1328), and possible slope adjustment (e.g., slp_adj 1336) by the ET Path 1300. The estimated slope value may represent a curve of a new LUT function (e.g., shaping function) according to a change in one or more operating conditions, as described above, and the new LUT function may also include a plurality of new defining values, including a new intercept value, a new maximum voltage $V_{max}$, a new minimum voltage $V_{min}$ and a new y-intercept of the slope with the maximum voltage $V_{max}$ of the supply voltage (e.g., from DC/DC 1304). In some aspects, the transceiver 1300 (e.g., FBR 1316, slope estimation circuitry 1320) detects a change in one or more operating conditions, by a change in feedback RF signal amplitude values, and determines a slope according to the new and/or changed set of operating conditions, for example, through linear interpolation using values of a stored LUT (e.g., slope values of a stored LUT).

In some aspects, as part of a soft ET operation, a new LUT (e.g., new LUT in LUT 1328) can define a set of parameters for a specific set of operating conditions (e.g., a specific temperature, operating frequency, operating bandwidth). For example, a soft ET operation may involve lowering the bandwidth of the ET path 1314 and providing a greater amount of voltage headroom to limit the regrowth of certain spurious products (e.g., for legal emissions requirements). In certain aspects, APR and/or soft ET operations may include determining a slope and an intercept value of the slope with a $V_{max}$ value of the DC/DC 1304 (e.g., maximum supply voltage before gain compression) for a specific set of operating conditions, adjusting the slope to a new value, determining a new intercept point of the new slope with the $V_{max}$ value, and based on that new intercept point, selecting a supply voltage below the $V_{max}$ value (e.g., Vcc_PAR_ave) to limit an average target output power (e.g., target output power $P_{out}$ of a PA) to a specified level (e.g., Pout_PAR_min). The intercept value of the slope with a $V_{max}$ value of the DC/DC 1304, for example, may correspond to the x-axis values (LUT Bin) of the graphs 1100 and 1200 (e.g., output of the LUT 1328). In some aspects, operations may include autonomously reducing a supply voltage value to the PA 1302 to a new supply voltage value that is lower than a threshold value, for example, a threshold value corresponding to supply voltage value in which any higher supply voltage would result in the PA 1302 entering a voltage saturated region.

In some aspects, the ILPC 1318 receives RF feedback data (e.g., RF signal amplitudes) from the output of the FBR 1316 and configures the device (e.g., device 100, device 1600) to adjust a supply voltage in accordance with the data received from the FBR 1316 (e.g., by adjusting a signal amplitude transmitted to DC/DC 1304 from the output of the ET Path 1314). In some aspects, an optimal slope value may result in the flattest AM-AM (RF gain) over power and hence the lowest distortion (ACLR) and modulation accuracy (EVM).

In some aspects, the FBR 1316 autonomously collects RF feedback data (e.g., AM-AM/RF gain data) using coherent feedback IQ data (e.g., |I+jQ| amplitude) versus a delayed reference amplitude signal from the transmit Digital Front End (DFE). This collection may run for a limited period of time (e.g., 100 μs) for low duty cycle (e.g., 10%) to limit impacts on other transmit functions and to reduce the average transmit current added from the FBR 1316. In some aspects, once AM-AM data is collected, for example, in an AM accumulator (e.g., 128 bin table stored in memory), the transceiver 1300 post-processes the AM-AM data to determine an average slope in RF gain during a current subframe for use in programming an ET operation of a subsequent subframe.

In some aspects, the transceiver 1300 (e.g., slope estimation circuitry 1320) adjusts a slope by calculating and updating using least-mean-squares (LMS). Once this is completed, the new slope value can be used at the beginning of a subsequent eligible subframe (e.g., ET mode). While the transceiver 1300 may adjust a slope value at multiple ET Transmit Power Control (TPC) commands, in some aspects, the transceiver 1300 may perform gain slope (GS) measurement and update the slope only at a subframe boundary (not at a slot boundary).

Graph 1332 illustrates an exemplary mapping between values of various LUT functions (e.g., shaping functions), such as LUT functions of LUT 1328, and the peak output power ($P_k P_{out}$). In some aspects, the various LUT functions may correspond to a different adjusted slope value (e.g., slp_adj a–slp_adj e), for example, at the output of slope estimation circuitry 1320. Graph 1334 illustrates an exemplary gain plot of various gain values according to various LUT functions and supply voltages (e.g., from DC/DC 1304).

Figure 14:
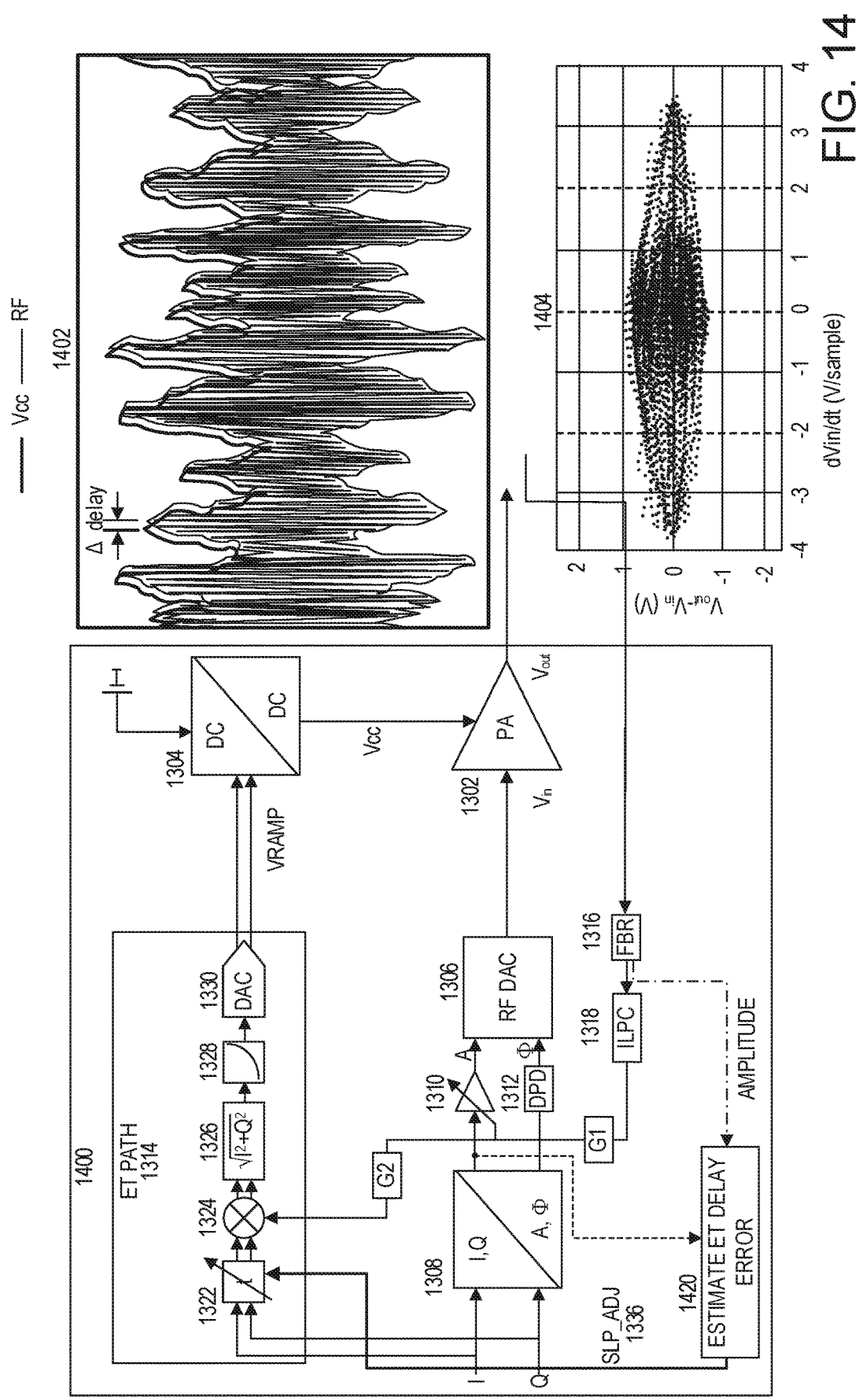
FIG. 14 illustrates an exemplary device for envelope tracking, in accordance with certain aspects.

FIG. 14 illustrates an exemplary device (e.g., transceiver) 1400 for envelope tracking, in accordance with certain aspects. In certain aspects, the device may be similar to transceiver 1300, including the components described above. In some aspects, the transceiver 1400 includes a ET delay error estimator 1420 to estimate ET delay error, by using amplitude values from the RF feedback data of the FBR 1316 and I/Q data from the modulation circuitry 1308, and transmit amplitude delay values (δ delay) to the delay circuitry 1322 of the ET Path 1314. The mixer 1324 may combine the values received from the ET delay error estimator 1320 (e.g., δ delay) with RF feedback data (e.g., RF signal amplitudes, AM-AM/RF gain data) from the ILPC 1318.

Graph 1402 illustrates exemplary plots of a modulated supply voltage signal from the output of the DC/DC 1304 and the modulated RF signal from the output of the PA 1302. As seen in the graph 1402, the DC/DC 1304 can provide a modulated supply voltage signal and adjust the power supply voltage to the supply input of the PA 1302 on a real-time basis, using RF signal feedback (e.g., collected from the FBR 1316). The timing delay (e.g., δ delay) between the supply voltage signal $V_{cc}$ and the RF signal from the output of the PA 1302 is also shown.

Graph 1404 illustrates an exemplary gain plot of the PA 1302, with the y-axis displaying $V_{out}-V_{in}$ (V) of the PA 1302 and the x-axis displaying input levels to the PA 1302, $dV_{in}/dt$ (V/sample). In certain aspects, the resultant gain values of the PA 1302 may be determined by the input signal voltage levels to the PA 1302 ($dV_{in}/dt$) and the input supply voltage levels ($V_{cc}$) from the DC/DC 1304.

In some aspects, the DC/DC 1304 may not generate an exact replica of the amplitude of the modulated RF output signal of the PA 1302 for the input supply voltage, $V_{cc}$. This may be to avoid. $V_{cc}$ falling into nulls of the RF output signal of the PA 1302 when the RF output signal gets very small. In such instances, the gain of the PA 1302 may collapse as opposed to remaining constant. Therefore, by using a ET CL operation and autonomously collecting RF feedback to generate adjusted slope values and new LUTs, the transceiver 1300 can improve power efficiency and prevent gain collapse.

In some aspects, the ET delay error estimator 1420 determines a slope value from a difference in RF Feedback amplitude and I/Q amplitude (|I+jQ|) (e.g., from modulation circuitry 1308 ($V_{out}-V_{in}$ on the y-axis of graph 1404)) versus a time derivative of an amplitude of |I+jQ| (e.g., from modulation circuitry 1308 (d|I+jQ|/dt on the x-axis)). In certain aspects, the ET delay error estimator 1420 estimates ET delay error based on this determination. Due to RF mixing occurring in the PA 1302 between an RF input signal (Vrf_in) and $V_{cc}$ on the supply terminal, in some aspects, a delay error in the $V_{cc}$ versus $V_{rf\_in}$ can result in a distortion that is detectable in an average slope of $V_{out}-V_{in}$ (e.g., of graph 1404) with respect to |I+jQ|/dt.

AM-AM Data Capture and Processing

In some aspects, after a subframe boundary (e.g., TPC boundary and an initial Average Power Control loop (APC)), the FBR 1316 measures feedback from the output of the PA 1302. In certain aspects, the length of the measurement (e.g., 100 µsec) may be configured in memory. In some aspects, the FBR 1316 bins a down converted IQ amplitude (e.g., captured from a post S-PAD coupler, PA 1302), Afb=|Ifb+jQb|, in an 128-bin accumulator Bin(i), with i addressed by the delayed reference IQ amplitude, and Aref(i)=|Iref+jQref| (e.g., from the Tx DFE). With each accumulation, the FBR 1316 can make a binned count increment to a second accumulator Ctr(i) using the same addressing. After the accumulation period, the average output amplitude, amplitude i, at the transceiver 1300 output may be represented by Aref(i)=Bin(i)/Ctr(i). In some aspects, prior to output power scaling, as the Are f (0 is captured from the transmit DFE, the Are f (i) may have a constant average value over power and the FBR collection block may be configured to scale and place the average amplitude at a fixed bin. In certain aspects, this may be done regardless of programmed antenna power.

Once the FBR 1316 collects the data (e.g., AM-AM data), for example, over a programmed collection period, the ET CL operation (e.g., firmware performing the ET CL operation) may include the transceiver 1300 taking a captured gain value (e.g., G(i)) and calculating a LMS fitting to establish the best average GS, for example, according to the GS equation, $G_{fit}(i)=GS \cdot i+G_{int}$ In some aspects, this calculation uses the quantities $\langle i \rangle$, $\langle G \rangle$, $\langle G \cdot i \rangle$, and $\langle G^2 \rangle$, where $\langle x \rangle$ is a weighted sum defined by: $\langle x \rangle = \sum_{i=i_{lo}}^{i_{hi}} x_i \cdot Ctr_i$. It is noted that a weighted average of x may be given by $\langle x \rangle / \langle 1 \rangle$, where $\langle 1 \rangle = N$ is the sum of the accumulated counts in all bins. The values $i_{hi}$ and $i_{lo}$ are windowing limits around the average bin $\langle i \rangle/N$ set by NVM as ±dB about the average bin.

Using these calculated sums, in some aspects, the GS, and slope intercept, $G_{int}$, may be given by the GS equations, $GS=(\langle G \cdot i \rangle \cdot N - \langle G \rangle \langle i \rangle)(\langle i^2 \rangle) \cdot N - \langle i \rangle \langle i \rangle)$ and $G_{int}=(\langle G \rangle - GS \cdot \langle i \rangle)N$. In some aspects, the fitted. GS may be the primary indicator of AM-AM gain distortion in an ET operation and the ETIC may use the fitted GS to adapt the ET LUT (e.g., LUT 1328), as discussed in the next section.

In some aspects, a secondary quantity may be the variance of the fitted gain: $V_{ar}=\langle (G-Gfit)^2 \rangle N$ and $V_{ar}=(\langle G^2 \rangle - 2GS \langle G \cdot i \rangle - 2G_{int} \langle G \rangle + GS^2 \cdot \langle i^2 \rangle + 2GS \cdot G_{int} \langle i \rangle + N \cdot G_{int}^2)N$.
The variance of the fitted gain may be a measure of the noise in the measured gain G(i) relative to the fitted gain $G_{fit}(i)$ and the will be used later to adapt the LUT slope adaption in the presence of blocker noise or output VSWR.

ET CL Slope Adaptation

In an ET operation, a linear relationship may exist between a slope of the ET LUT (e.g., LUT 1328) and a resulting AM-AM gain characteristic (RF gain over power) of PA (e.g., PA 1302) RF output. In some aspects, if an ET LUT slope is too high, an AM-AM gain characteristic may display a gain increase with instantaneous RF power (e.g., AM-AM upslope). Alternatively, if an ET LUT slope is too low, an AM-AM gain characteristic may display a gain decrease with instantaneous RF power (e.g., AM-AM downslope). In some aspects, based on these characteristics, the following LMS control law may be applicable:

$$LUT'_{slope} = LUT_{slope} \cdot cl\_slope\_adj, \text{ where } cl \text{ slope} $$
$$adj \leftarrow cl \text{ slope } adj - LF \cdot GS$$

In some aspects, the parameter cl_slope_adj is a running correction factor to a characterized ET LUT slope parameter, for example, to a previous value used for the ET LUT (e.g., LUT 1328) with a corresponding measured GS. In certain aspects, the GS value may be subtracted from the parameter cl_slope_adj with a learning factor (LF) (e.g., set in memory) that gives smooth convergence to an optimal gain value. In other aspects, an offsetting change to a LUT_intercept value may be calculated (e.g., by the ETIC) according to the following LUT intercept equation:

$$LUT'_{intercept} = LUT_{intercept} + (1 - cl\_slope\_adj) \cdot LUT_{slope} \cdot idx_{ave},$$

where $idx_{ave}$ is an average LUT bin at a current TPC target power. This may result in a desired change in LUT slope (e.g., with cl_slope_adj), without a corresponding change in $V_{cc}$ (average).

In certain aspects, the transceiver 1300 (e.g., DC/DC 1304) may use the ET CL operation to continually adjust the ET LUT slope correction in the cl_slope_adj parameter using AM-AM gain measurements taken at the start of TPC (e.g., start of a subframe boundary for TPC) and the AM-AM gain measurements may be performed by the FBR 1316. In some aspects, the DC/DC 1304 may apply the cl_slope_adj parameter to adjust the slope of the ET LUT using pre-existing code.

In some aspects, the transceiver (e.g., 1300, 1400) may determine, during the operation of ET CL at a subframe boundary for TPC, to measure the AM-AM gain to find a GS, to apply the measured GS via LMS to adjust a running ET LUT slope correction parameter (e.g., cl_slope_adj) directly after the measurement if gain fitting statistics are suitable, and to apply the running correction to any TPC (e.g., subframe) for which ET is enabled, unless the TPC conditions are significantly changed and it is desirable to reset the cl_slope_adj value back to zero. In certain aspects, at the beginning of an ET CL operation (e.g., TxPrep), the transceiver (e.g., 1300, 1400) may reset an existing cl_slope_adj value if ET CL parameters (e.g., TxPrep parameters) are significantly changed from a previous parameter value. In some aspects, this may apply to TDD, where each frame of data is started with a ET CL parameter (e.g., TxPrep parameter), and a previous cl_slope_adj parameter is likely to be applicable.

In some aspects, control rules for an ET CL operation (e.g., Loop Control Rules) may include one or more of an Measurement enable/disable ("Disable") rule, a Loop correction Reset ("Reset") rule, and a Correction Update ("Update") rule. The transceiver (e.g., 1300, 1400), in some aspects, may apply such rules for an ET CL operation. The Measurement enable/disable ("Disable") rule may apply when a AM-AM GS measurement is only to be performed at a subframe boundary and for normal ET operation. The Loop correction Reset ("Reset") rule may apply when, at the beginning of the ET CL operation (e.g., TxPrep), a running value of the ET closed loop correction cl_slope_adj parameter is reset only if the component carrier frequencies and bandwidths have changed from the prior TxPrep. The Correction Update ("Update") rule may apply when a measurement of GS has a poor fitting (e.g., due to noisy data) and thus would not be optimal for use in updating the cl_slope_adj parameter. In such instances, the update could be skipped, but a LF Adaptation process may be applied instead to achieve a more robust result.

Figure 15:
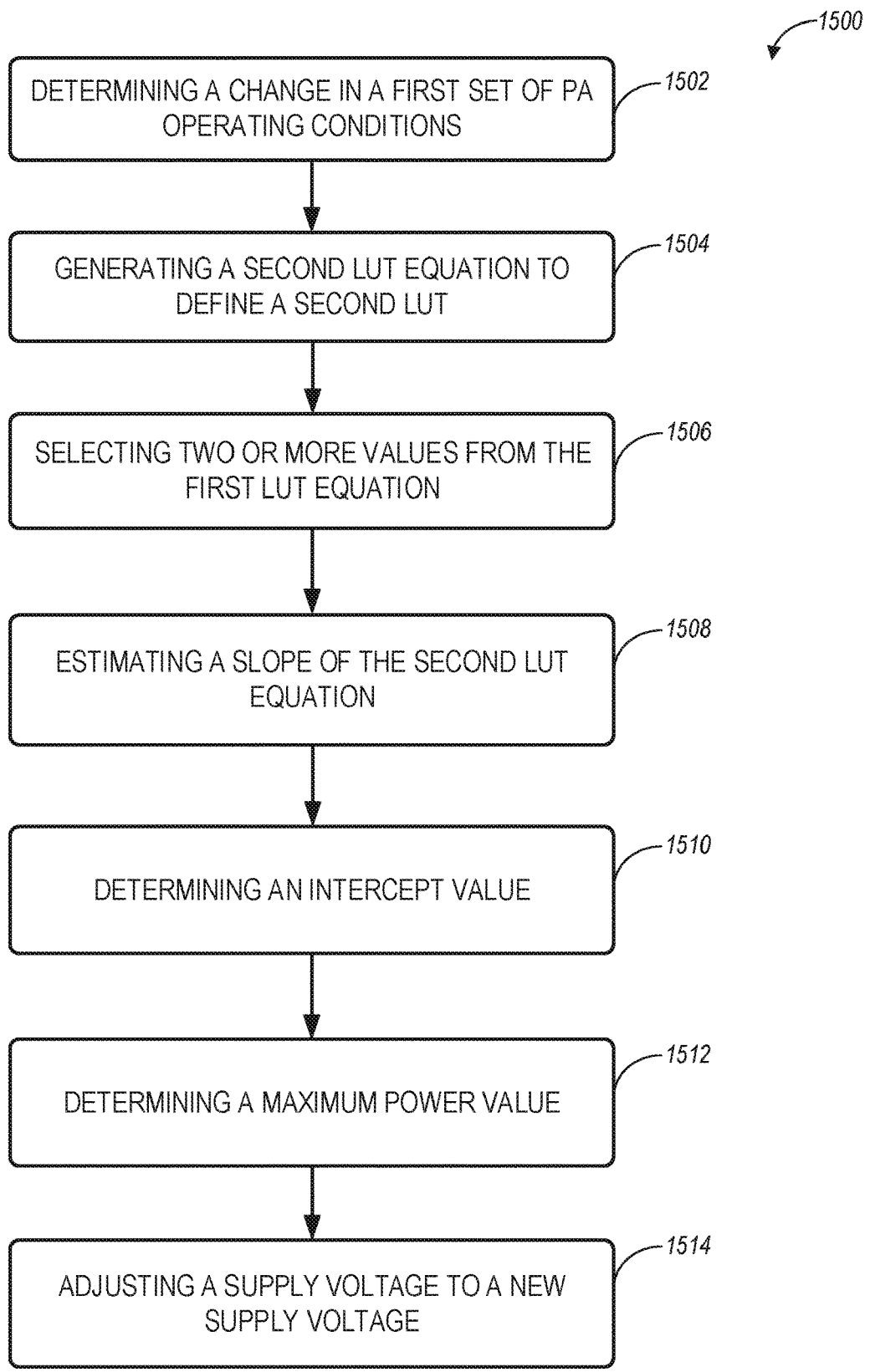
FIG. 15 illustrates a method of an envelope tracking operation, in accordance with certain aspects.

FIG. 15 illustrates an exemplary method 1500 of an envelope tracking operation, in accordance with certain aspects. In some aspects, with reference to FIGS. 11-14, and device 100 and/or device 1600, the method 1500 illustrates an example of envelope tracking, which may include autonomous power reduction (APR), soft envelope tracking, and envelope tracking closed loop. The method can begin with operation 1502, wherein a device, for example a device including the transceiver 1300 described above with respect to FIG. 13, may determine a change in a first set of power amplifier (PA) operating conditions. In some aspects, the first set of PA operating conditions can correspond to a LUT defined by a first LUT equation and a maximum supply voltage value (e.g., and a minimum supply voltage value). In operation 1504, the device may generate a second LUT equation to define a second LUT, for example, for a second set of PA operating conditions that correspond to the second LUT. In some aspects of generating the second LUT equation, as in operations 1506-1512, the device selects two or more values from the first LUT equation (operation 1506). In operation 1508, the device estimates a slope of the second LUT equation, for example, by linearly interpolating the two or more values, according to the second set of PA operating conditions. In operation 1510, the device determines an intercept value, for example, the intercept value defining an interception point of the slope of the second LUT equation with the maximum supply voltage value. In some aspects, the device can extrapolate the slope of the second LUT equation to determine an intercept value. In operation 1512, the device determines a maximum power value, for example based on the intercept value. In operation 1514, the device adjusts, based on the maximum power value, a supply voltage input for the PA to a new supply voltage value. In some aspects, a device can adjust the supply voltage input for the PA by modulating a battery voltage with the new supply voltage value. In some aspects, adjusting the supply voltage input for the PA may involve autonomously reducing the supply voltage input for the PA such that the new supply voltage value is lower than a threshold value, where the threshold value would result in a voltage saturated region of the PA.

With respect to operation 1502, in some aspects, the device can determine a change in the first set of PA operating conditions by receiving feedback signaling from the output of the PA, and then determine the change in the first set of a PA operating conditions according to the feedback signaling. In such aspects, the device can estimate the slope of the second LUT equation by linearly interpolating the two or more values according to the feedback signaling, wherein the feedback signaling corresponds to the second set of PA operating conditions. With respect to operation 1508, the device may further adjust a linearity of the slope of the second LUT equation based on the feedback signaling.

With respect to operations 1502-1504, in some aspects, both the first set of a PA operating conditions and the second set of a PA operating conditions may include an ambient temperature of the PA, an operating bandwidth of the PA, or an operating frequency of the PA. Further, any of these operating conditions from the first set of a PA operating conditions may be the same or may differ from corresponding values of operating condition of the second set of a PA operating conditions.

Figure 16:
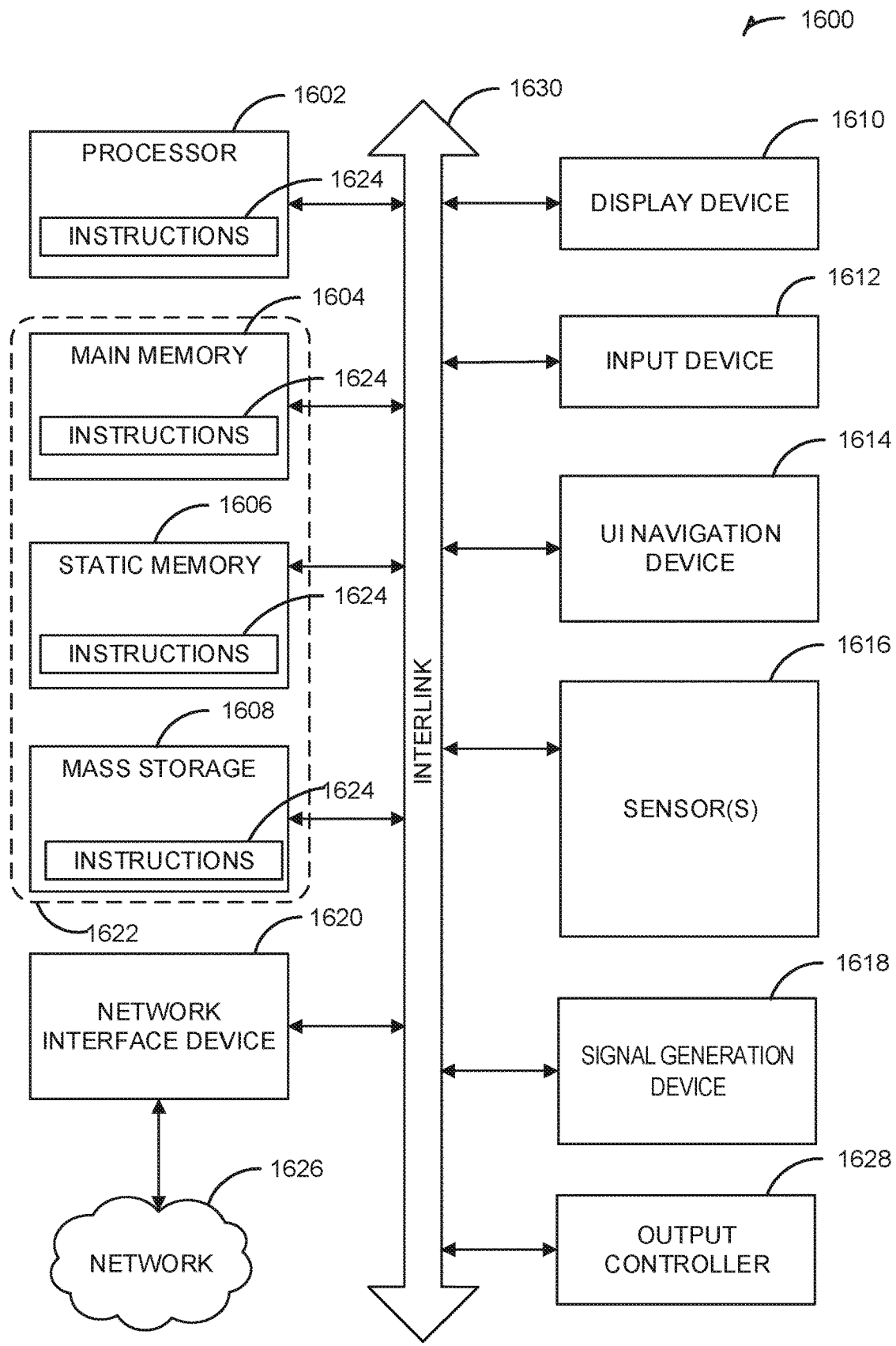
FIG. 16 illustrates a block diagram of an example machine, in accordance with certain aspects.

FIG. 16 illustrates a block diagram of an example machine (e.g., wireless communication device) 1600 upon which any one or more of the techniques (e.g., methodologies) discussed herein may be performed, for example, envelope tracking, which may include autonomous power reduction (APR), soft envelope tracking, and envelope tracking closed loop. Examples, as described herein, may include, or may operate by, logic or a number of components, or mechanisms in the machine 1600. Circuitry (e.g., processing circuitry) is a collection of circuits implemented in tangible entities of the machine 1600 that include hardware (e.g., simple circuits, gates, logic, etc.). Circuitry membership may be flexible over time. Circuitries include members that may, alone or in combination, perform specified operations when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a machine readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable embedded hardware (e.g., the execution units or a loading mechanism) to create members of the circuitry in hardware via the variable connections to carry out portions of the specific operation when in operation. Accordingly, in an example, the machine readable medium elements are part of the circuitry or are communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time. Additional examples of these components with respect to the machine 1600 follow.

In alternative aspects, the machine 1600 may operate as a standalone device or may be connected (e.g., networked) to other machines. In a networked deployment, the machine 1600 may operate in the capacity of a server machine, a client machine, or both in server-client network environments. In an example, the machine 1600 may act as a peer machine in peer-to-peer (P2P) (or other distributed) network environment. The machine 1600 may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The machine (e.g., computer system) 1600 may include a hardware processor 1602 (e.g., a central processing unit (CPU), a graphics processing unit (GPU), a hardware processor core, or any combination thereof), a main memory 1604, a static memory (e.g., memory or storage for firmware, microcode, a basic-input-output (BIOS), unified extensible firmware interface (UEFI), etc.) 1606, and mass storage 1608 (e.g., hard drive, tape drive, flash storage, or other block devices) some or all of which may communicate with each other via an interlink (e.g., bus) 1630. The machine 1600 may further include a display unit 1610, an alphanumeric input device 1612 (e.g., a keyboard), and a user interface (UI) navigation device 1614 (e.g., a mouse). In an example, the display unit 1610, input device 1612 and UI navigation device 1614 may be a touch screen display. The machine 1600 may additionally include a storage device (e.g., drive unit) 1608, a signal generation device 1618 (e.g., a speaker), a network interface device 1620, and one or more sensors 1616, such as a global positioning system (GPS) sensor, compass, accelerometer, or other sensor. The machine 1600 may include an output controller 1628, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

Registers of the processor 1602, the main memory 1604, the static memory 1606, or the mass storage 1608 may be, or include, a machine readable medium 1622 on which is stored one or more sets of data structures or instructions 1624 (e.g., software) embodying or utilized by any one or more of the techniques or functions described herein. The instructions 1624 may also reside, completely or at least partially, within any of registers of the processor 1602, the main memory 1604, the static memory 1606, or the mass storage 1608 during execution thereof by the machine 1600. In an example, one or any combination of the hardware processor 1602, the main memory 1604, the static memory 1606, or the mass storage 1608 may constitute the machine readable media 1622. While the machine readable medium 1622 is illustrated as a single medium, the term "machine readable medium" may include a single medium or multiple media (e.g., a centralized or distributed database, and/or associated caches and servers) configured to store the one or more instructions 1624.

The term "machine readable medium" may include any medium that is capable of storing, encoding, or carrying instructions for execution by the machine 1600 and that cause the machine 1600 to perform any one or more of the techniques of the present disclosure, or that is capable of storing, encoding or carrying data structures used by or associated with such instructions. Non-limiting machine readable medium examples may include solid-state memories, optical media, magnetic media, and signals (e.g., radio frequency signals, other photon based signals, sound signals, etc.). In an example, a non-transitory machine readable medium comprises a machine readable medium with a plurality of particles having invariant (e.g., rest) mass, and thus are compositions of matter. Accordingly, non-transitory machine-readable media are machine readable media that do not include transitory propagating signals. Specific examples of non-transitory machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 1624 may be further transmitted or received over a communications network 1626 using a transmission medium via the network interface device 1620 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 1620 may include one or more physical jacks (e.g., Ethernet, coaxial, or phone jacks) or one or more antennas to connect to the communications network 1626. In an example, the network interface device 1620 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 1600, and includes digital or analog communications signals or other intangible medium to facilitate communication of such software. A transmission medium is a machine readable medium.

EXAMPLES

Although an aspect has been described with reference to specific example aspects, it will be evident that various modifications and changes may be made to these aspects without departing from the broader spirit and scope of the present disclosure. Accordingly, the specification and drawings are to be regarded in an illustrative rather than a restrictive sense. The accompanying drawings that form a part hereof show, by way of illustration, and not of limitation, specific aspects in which the subject matter may be practiced. The aspects illustrated are described in sufficient detail to enable those skilled in the art to practice the teachings disclosed herein. Other aspects may be utilized and derived therefrom, such that structural and logical substitutions and changes may be made without departing from the scope of this disclosure. This Detailed Description, therefore, is not to be taken in a limiting sense, and the scope of various aspects is defined only by the appended claims, along with the full range of equivalents to which such claims are entitled.

Such aspects of the inventive subject matter may be referred to herein, individually and/or collectively, by the term "aspect" merely for convenience and without intending to voluntarily limit the scope of this application to any single aspect or inventive concept if more than one is in fact disclosed. Thus, although specific aspects have been illustrated and described herein, it should be appreciated that any arrangement calculated to achieve the same purpose may be substituted for the specific aspects shown. This disclosure is intended to cover any and all adaptations or variations of various aspects. Combinations of the above aspects, and other aspects not specifically described herein, will be apparent to those of skill in the art upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, UE, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single aspect for the purpose of streamlining the disclosure. This method of disclosure is not to be interpreted as reflecting an intention that the claimed aspects require more features than are expressly recited in each claim. Rather, as the following claims reflect, inventive subject matter lies in less than all features of a single disclosed aspect. Thus the following claims are hereby incorporated into the Detailed Description, with each claim standing on its own as a separate aspect.

The following describes various examples of methods, machine-readable media, and systems (e.g., machines, devices, or other apparatus) discussed herein.

Example 1 is an apparatus of a wireless communication device, comprising: memory; and processing circuitry to configure the wireless communication device for an envelope tracking operation, wherein as part of the envelope tracking operation, the processing circuitry is configured to: determine a change in a first set of power amplifier (PA) operating conditions, wherein the first set of PA operating conditions corresponds to a first look up table (LUT) defined by a first LUT equation and a maximum supply voltage value; generate a second LUT equation to define a second LUT, wherein a second set of PA operating conditions corresponds to the second LUT, the generating including: select two or more values from the first LUT equation, stored in the memory; estimate a slope of the second LUT equation by linearly interpolating the two or more values, according to the second set of PA operating conditions; extrapolate the slope of the second LUT equation to determine an intercept value; wherein the intercept value defines an interception point of the slope of the second LUT equation with the maximum supply voltage value; and determine, based on the intercept value, a maximum power value; and adjust a supply voltage input for the PA to a new supply voltage value according to the maximum power value.

In Example 2, the subject matter of Example 1 includes, wherein the processing circuitry is configured to adjust the supply voltage input for the PA by modulating a battery voltage with the new supply voltage value.

In Example 3, the subject matter of Example 2 includes, wherein the processing circuitry is configured to autonomously reduce the supply voltage input for the PA such that the new supply voltage value is lower than a threshold value, the threshold value resulting in a voltage saturated region of the PA.

In Example 4, the subject matter of Example 3 includes, wherein the processing circuitry is further configured to: configure transceiver circuitry to receive feedback signaling; determine the change in the first set of a PA operating conditions according to the feedback signaling, and estimate the slope of the second LUT equation by linearly interpolating the two or more values according to the feedback signaling, and wherein the feedback signaling corresponds to the second set of PA operating conditions.

In Example 5, the subject matter of Example 4 includes, wherein the processing circuitry is configured to configure the transceiver circuitry to receive the feedback signaling from the output of the PA.

In Example 6, the subject matter of Examples 1-5 includes; wherein the maximum power value is a maximum power output value of the PA, and wherein the new supply voltage value is a voltage that is less than or equal to the supply voltage input for the PA, when the supply voltage input for the PA results in the maximum power output value of the PA.

In Example 7, the subject matter of Examples 1-6 includes, wherein the maximum power value is a variable of the second LUT equation and corresponds to an amplitude of an input signal to the PA.

In Example 8, the subject matter of Examples 1-7 includes, wherein the two or more values define a slope of the first LUT equation.

In Example 9, the subject matter of Example 8 includes, wherein the slope of the first LUT equation is a gain slope (GS) and the intercept value defines an interception point of the GS of the first LUT equation with the maximum supply voltage value.

In Example 10, the subject matter of Examples 5-9 includes, wherein the first set of a PA operating conditions and the second set of a PA operating conditions each define operating conditions including one or more of an ambient temperature of the PA, an operating bandwidth of the PA, or an operating frequency of the PA; and wherein a value of at least one operating condition of the first set of a PA operating conditions differs from a value of a corresponding operating condition of the second set of a PA operating conditions.

In Example 11, the subject matter of Examples 5-10 includes, wherein the processing circuitry is further configured to adjust, based on the feedback signaling, a linearity of the slope of the second LUT equation.

In Example 12, the subject matter of Examples 1-11 includes, wherein the processing circuitry is a baseband processor.

In Example 13, the subject matter of Examples 6-12 includes, wherein the apparatus further comprises two or more antennas and a transceiver, the two or more antennas and the transceiver configured to transmit radio frequency (RE) signaling according to the maximum power value.

Example 14 is a computer-readable hardware storage device that stores instructions for execution by one or more processors of a wireless communication device, the instructions to configure the one or more processors to: configure the wireless communication device for an envelope tracking operation, wherein as part of the envelope tracking operation, the instructions are to configure the one or more processors to: determine a change in a first set of power amplifier (PA) operating conditions, wherein the first set of PA operating conditions corresponds to a first look up table (LUT) defined by a first LUT equation and a maximum supply voltage value; generate a second LUT equation to define a second LUT, wherein a second set of PA operating conditions corresponds to the second LUT, the generating including: select two or more values from the first LUT equation; estimate a slope of the second LUT equation by linearly interpolating the two or more values, according to the second set of PA operating conditions; extrapolate the slope of the second LUT equation to determine an intercept value, wherein the intercept value defines an interception point of the slope of the second LUT equation with the maximum supply voltage value; and determine, based on the intercept value, a maximum power value; and adjust a supply voltage input for the PA to a new supply voltage value according to the maximum power value.

In Example 15, the subject matter of Example 14 includes, wherein the instructions are to configure the one or more processors to adjust the supply voltage input for the PA by modulating a battery voltage with the new supply voltage value.

In Example 16, the subject matter of Example 15 includes, wherein the instructions are to configure the one or more processors to autonomously reduce the supply voltage input for the PA such that the new supply voltage value is lower than a threshold value, the threshold value resulting in a voltage saturated region of the PA.

In Example 17, the subject matter of Example 16 includes, wherein the instructions are to configure the one or more processors to: configure transceiver circuitry to receive feedback signaling from the output of the PA and determine the change in the first set of a PA operating conditions according to the feedback signaling, and estimate the slope of the second LUT equation by linearly interpolating the two or more values according to the feedback signaling, and wherein the feedback signaling corresponds to the second set of PA operating conditions.

In Example 18, the subject matter of Examples 14-17 includes, wherein the maximum power value is a maximum power output value of the PA, and wherein the new supply voltage value is a voltage that is less than or equal to the supply voltage input for the PA, when the supply voltage input for the PA results in the maximum power output value of the PA.

In Example 19, the subject matter of Examples 14-18 includes, wherein the maximum power value is a variable of the second LUT equation and corresponds to an amplitude of an input signal to the PA.

Example 20 is a method of envelope tracking, the method comprising: determining a change in a first set of power amplifier (PA) operating conditions, wherein the first set of PA operating conditions corresponds to a first look up table (LUT) defined by a first LUT equation and a maximum supply voltage value; generating a second LUT equation to define a second. LUT, wherein a second set of PA operating conditions corresponds to the second LUT, the generating including: selecting two or more values from the first LUT equation; estimating a slope of the second LUT equation by linearly interpolating the two or more values, according to the second set of PA operating conditions; extrapolating the slope of the second LUT equation to determine an intercept value, wherein the intercept value defines an interception point of the slope of the second LUT equation with the maximum supply voltage value; and determining, based on the intercept value, a maximum power value; and adjusting a supply voltage input for the PA to a new supply voltage value according to the maximum power value.

In Example 21, the subject matter of Example 20 includes, adjusting the supply voltage input for the PA by modulating a battery voltage with the new supply voltage value.

In Example 22, the subject matter of Example 21 includes, autonomously reducing the supply voltage input for the PA such that the new supply voltage value is lower than a threshold value, the threshold value resulting in a voltage saturated region of the PA.

In Example 23, the subject matter of Example 22 includes, receiving feedback signaling from the output of the PA and determining the change in the first set of a PA operating conditions according to the feedback signaling; and estimating the slope of the second LUT equation by linearly interpolating the two or more values according to the feedback signaling, and wherein the feedback signaling corresponds to the second set of PA operating conditions.

In Example 24, the subject matter of Example 23 includes, adjusting, based on the feedback signaling, a linearity of the slope of the second LUT equation.

In Example 25, the subject matter of Examples 23-24 includes, wherein the first set of a PA operating conditions and the second set of a PA operating conditions each define operating conditions including one or more of: an ambient temperature of the PA, an operating bandwidth of the PA, or an operating frequency of the PA; and wherein a value of at least one operating condition of the first set of a PA operating conditions differs from a value of a corresponding operating condition of the second set of a PA operating conditions.

Example 26 is at least one machine-readable medium including instructions that, when executed by processing circuitry, cause the processing circuitry to perform operations to implement of any of Examples 1-25.

Example 27 is an apparatus comprising means to implement of any of Examples 1-25.

Example 28 is a system to implement of any of Examples 1-25.

Example 29 is a method to implement of any of Examples 1-25.

What is claimed is:

1. An apparatus of a wireless communication device, comprising:
   memory; and
   processing circuitry to configure the wireless communication device for an envelope tracking operation, wherein as part of the envelope tracking operation, the processing circuitry is configured to:
   determine a change in a first set of power amplifier (PA) operating conditions, wherein the first set of PA operating conditions corresponds to a first look up table (LUT) defined by a first LUT equation and a maximum supply voltage value;
   generate a second LUT equation to define a second LUT, wherein a second set of PA operating conditions corresponds to the second LUT, the generating including:
   select two or more values from the first LUT equation, stored in the memory;
   estimate a slope of the second LUT equation by linearly interpolating the two or more values, according to the second set of PA operating conditions;
   extrapolate the slope of the second LUT equation to determine an intercept value, wherein the intercept value defines an interception point of the slope of the second LUT equation with the maximum supply voltage value; and
   determine, based on the intercept value, a maximum power value; and
   adjust a supply voltage input for the PA to a new supply voltage value according to the maximum power value.

2. The apparatus of claim 1, wherein the processing circuitry is configured to adjust the supply voltage input for the PA by modulating a battery voltage with the new supply voltage value.

3. The apparatus of claim 2, wherein the processing circuitry is configured to autonomously reduce the supply voltage input for the PA such that the new supply voltage value is lower than a threshold value, the threshold value resulting in a voltage saturated region of the PA.

4. The apparatus of claim 3, wherein the processing circuitry is further configured to:
   configure transceiver circuitry to receive feedback signaling;
   determine the change in the first set of a PA operating conditions according to the feedback signaling, and
   estimate the slope of the second LUT equation by linearly interpolating the two or more values according to the feedback signaling, and wherein the feedback signaling corresponds to the second set of PA operating conditions.

5. The apparatus of claim 1, wherein the processing circuitry is configured to configure the transceiver circuitry to receive the feedback signaling from the output of the PA.

6. The apparatus of claim 1, wherein the maximum power value is a maximum power output value of the PA, and wherein the new supply voltage value is a voltage that is less than or equal to the supply voltage input for the PA, when the supply voltage input for the PA results in the maximum power output value of the PA.

7. The apparatus of claim 1, wherein the maximum power value is a variable of the second LUT equation and corresponds to an amplitude of an input signal to the PA.

8. The apparatus of claim 1, wherein the two or more values define a slope of the first LUT equation.

9. The apparatus of claim 8, wherein the slope of the first LUT equation is a gain slope (GS) and the intercept value defines an interception point of the GS of the first LUT equation with the maximum supply voltage value.

10. The apparatus of claim 5, wherein the first set of a PA operating conditions and the second set of a PA operating conditions each define operating conditions including one or more of: an ambient temperature of the PA, an operating bandwidth of the PA, or an operating frequency of the PA; and wherein a value of at least one operating condition of the first set of a PA operating conditions differs from a value of a corresponding operating condition of the second set of a PA operating conditions.

11. The apparatus of claim 5, wherein the processing circuitry is further configured to adjust, based on the feedback signaling, a linearity of the slope of the second LUT equation.

12. The apparatus of claim 1, wherein the processing circuitry is a baseband processor.

13. The apparatus of claim 6, wherein the apparatus further comprises two or more antennas and a transceiver, the two or more antennas and the transceiver configured to transmit radio frequency (RF) signaling according to the maximum power value.

14. A computer-readable hardware storage device that stores instructions for execution by one or more processors of a wireless communication device, the instructions to configure the one or more processors to:
- configure the wireless communication device for an envelope tracking operation, wherein as part of the envelope tracking operation, the instructions are to configure the one or more processors to:
- determine a change in a first set of power amplifier (PA) operating conditions, wherein the first set of PA operating conditions corresponds to a first look up table (LUT) defined by a first LUT equation and a maximum supply voltage value;
- generate a second LUT equation to define a second LUT, wherein a second set of PA operating conditions corresponds to the second LUT, the generating including:
- select two or more values from the first LUT equation;
- estimate a slope of the second LUT equation by linearly interpolating the two or more values, according to the second set of PA operating conditions;
- extrapolate the slope of the second LUT equation to determine an intercept value, wherein the intercept value defines an interception point of the slope of the second LUT equation with the maximum supply voltage value; and
- determine, based on the intercept value, a maximum power value; and
- adjust a supply voltage input for the PA to a new supply voltage value according to the maximum power value.

15. The computer-readable hardware storage device of claim 14, wherein the instructions are to configure the one or more processors to adjust the supply voltage input for the PA by modulating a battery voltage with the new supply voltage value.

16. The computer-readable hardware storage device of claim 15, wherein the instructions are to configure the one or more processors to autonomously reduce the supply voltage input for the PA such that the new supply voltage value is lower than a threshold value, the threshold value resulting in a voltage saturated region of the PA.

17. The computer-readable hardware storage device of claim 14, wherein the instructions are to configure the one or more processors to:
- configure transceiver circuitry to receive feedback signaling from the output of the PA and determine the change in the first set of a PA operating conditions according to the feedback signaling, and
- estimate the slope of the second LUT equation by linearly interpolating the two or more values according to the feedback signaling, and wherein the feedback signaling corresponds to the second set of PA operating conditions.

18. The computer-readable hardware storage device of claim 14, wherein the maximum power value is a maximum power output value of the PA, and wherein the new supply voltage value is a voltage that is less than or equal to the supply voltage input for the PA, when the supply voltage input for the PA results in the maximum power output value of the PA.

19. The computer-readable hardware storage device of claim 14, wherein the maximum power value is a variable of the second LUT equation and corresponds to an amplitude of an input signal to the PA.

20. A method of envelope tracking, the method comprising:
- determining a change in a first set of power amplifier (PA) operating conditions, wherein the first set of PA operating conditions corresponds to a first look up table (LUT) defined by a first LUT equation and a maximum supply voltage value;
- generating a second LUT equation to define a second LUT, wherein a second set of PA operating conditions corresponds to the second LUT, the generating including:
- selecting two or more values from the first LUT equation;
- estimating a slope of the second LUT equation by linearly interpolating the two or more values, according to the second set of PA operating conditions;
- extrapolating the slope of the second LUT equation to determine an intercept value, wherein the intercept value defines an interception point of the slope of the second LUT equation with the maximum supply voltage value; and
- determining, based on the intercept value, a maximum power value; and
- adjusting a supply voltage input for the PA to a new supply voltage value according to the maximum power value.

21. The method of claim 20, further comprising adjusting the supply voltage input for the PA by modulating a battery voltage with the new supply voltage value.

22. The method of claim 21, further comprising autonomously reducing the supply voltage input for the PA such that the new supply voltage value is lower than a threshold value, the threshold value resulting in a voltage saturated region of the PA.

23. The method of claim 22, further comprising:
- receiving feedback signaling from the output of the PA and determining the change in the first set of a PA operating conditions according to the feedback signaling, and
- estimating the slope of the second LUT equation by linearly interpolating the two or more values according to the feedback signaling, and wherein the feedback signaling corresponds to the second set of PA operating conditions.

24. The method of claim 20, further comprising adjusting, based on the feedback signaling, a linearity of the slope of the second LUT equation.

25. The method of claim 23, wherein the first set of a PA operating conditions and the second set of a PA operating conditions each define operating conditions including one or more of: an ambient temperature of the PA, an operating bandwidth of the PA, or an operating frequency of the PA; and wherein a value of at least one operating condition of the first set of a PA operating conditions differs from a value of a corresponding operating condition of the second set of a PA operating conditions.

* * * * *